US007629235B2

(12) United States Patent
Yamazaki et al.

(10) Patent No.: US 7,629,235 B2
(45) Date of Patent: Dec. 8, 2009

(54) METHOD FOR MANUFACTURING A SEMICONDUCTOR DEVICE THAT INCLUDES ADDING NOBLE GAS TO A SEMICONDUCTOR FILM AND THEN IRRADIATING THE SEMICONDUCTOR FILM WITH LASER LIGHT IN THE PRESENCE OF A MAGNETIC FIELD

(75) Inventors: Shunpei Yamazaki, Tokyo (JP); Osamu Nakamura, Kanagawa (JP); Hironobu Shoji, Tokyo (JP); Koichiro Tanaka, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 525 days.

(21) Appl. No.: 11/471,494

(22) Filed: Jun. 21, 2006

(65) Prior Publication Data

US 2006/0237397 A1    Oct. 26, 2006

Related U.S. Application Data

(62) Division of application No. 10/700,516, filed on Nov. 5, 2003, now Pat. No. 7,067,403.

(30) Foreign Application Priority Data

Nov. 8, 2002    (JP)    ............................. 2002-325383

(51) Int. Cl.
*H01L 21/36*    (2006.01)
(52) U.S. Cl. ...................................... 438/487; 438/795
(58) Field of Classification Search .................. 438/487
See application file for complete search history.

(56) References Cited

U.S. PATENT DOCUMENTS

| | | | |
|---|---|---|---|
| 5,643,801 | A | 7/1997 | Ishihara et al. |
| 5,897,799 | A | 4/1999 | Yamazaki et al. |
| 5,900,980 | A | 5/1999 | Yamazaki et al. |
| 5,923,962 | A | 7/1999 | Ohtani et al. |
| 5,953,597 | A | 9/1999 | Kusumoto et al. |

(Continued)

FOREIGN PATENT DOCUMENTS

| | | |
|---|---|---|
| JP | 61-187223 | 8/1986 |
| JP | 63-096908 | 4/1988 |
| JP | 05-267771 | 10/1993 |
| JP | 07-183540 | 7/1995 |
| JP | 07-187890 | 7/1995 |

(Continued)

OTHER PUBLICATIONS

Specification and Drawings for Related U.S. Appl. No. 10/701,174, filed on Nov. 5, 2003.

*Primary Examiner*—Stephen W Smoot
(74) *Attorney, Agent, or Firm*—Nixon Peabody LLP; Jeffrey L. Costellia

(57)    ABSTRACT

According to the present invention, oxygen and nitrogen are effectively prevented from mixing into the semiconductor film by doping Ar or the like in the semiconductor film in advance, and by irradiating the laser light in the atmosphere of Ar or the like. Therefore, the variation of the impurity concentration due to the fluctuation of the energy density can be suppressed and the variation of the mobility of the semiconductor film can be also suppressed. Moreover, in TFT formed with the semiconductor film, the variation of the on-current in addition to the mobility can be also suppressed. Furthermore, in the present invention, the first laser light converted into the harmonic easily absorbed in the semiconductor film is irradiated to melt the semiconductor film and to increase the absorption coefficient of the fundamental wave.

18 Claims, 11 Drawing Sheets

U.S. PATENT DOCUMENTS

| | | |
|---|---|---|
| 5,959,779 A | 9/1999 | Yamazaki et al. |
| 6,002,523 A | 12/1999 | Tanaka |
| 6,022,458 A | 2/2000 | Ichikawa |
| 6,038,075 A | 3/2000 | Yamazaki et al. |
| 6,071,796 A | 6/2000 | Voutsas |
| 6,429,097 B1 | 8/2002 | Voutsas et al. |
| 6,544,825 B1 | 4/2003 | Yamazaki |
| 6,548,370 B1 | 4/2003 | Kasahara et al. |
| 6,861,338 B2 | 3/2005 | Maekawa |
| 7,067,403 B2 | 6/2006 | Yamazaki et al. |
| 2003/0089911 A1 | 5/2003 | Kasahara et al. |
| 2003/0129790 A1 | 7/2003 | Yamazaki et al. |
| 2003/0148565 A1 | 8/2003 | Yamanaka |
| 2004/0069751 A1 | 4/2004 | Yamazaki et al. |
| 2004/0087116 A1 | 5/2004 | Nakayama |
| 2004/0119955 A1 | 6/2004 | Tanaka |
| 2004/0171237 A1 | 9/2004 | Tanaka et al. |
| 2004/0259387 A1 | 12/2004 | Yamazaki et al. |
| 2007/0099440 A1 | 5/2007 | Yamazaki et al. |

FOREIGN PATENT DOCUMENTS

| | | |
|---|---|---|
| JP | 11-176752 | 7/1999 |
| JP | 11-261078 | 9/1999 |
| JP | 2000-012484 | 1/2000 |
| JP | 2000-138180 | 5/2000 |
| JP | 2000-182956 | 6/2000 |
| JP | 2000-294793 | 10/2000 |
| JP | 2001-223175 | 8/2001 |
| JP | 2001-223359 | 8/2001 |
| JP | 2004-039890 A | 2/2004 |
| JP | 2004-179356 A | 6/2004 |
| JP | 2004-289140 A | 10/2004 |

FIG. 2
(A)
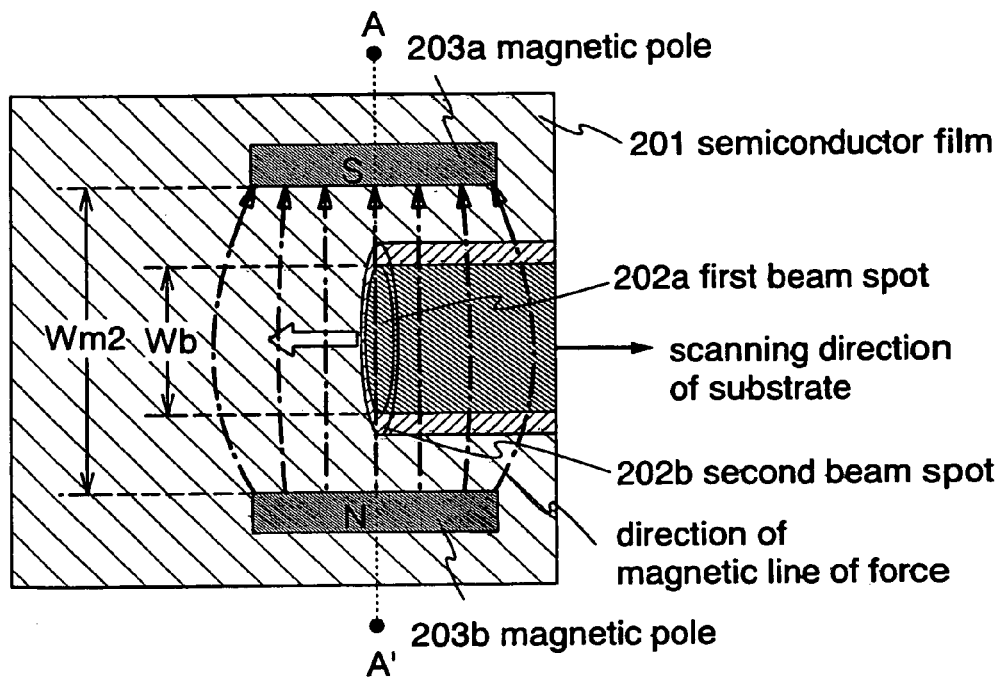
(B)
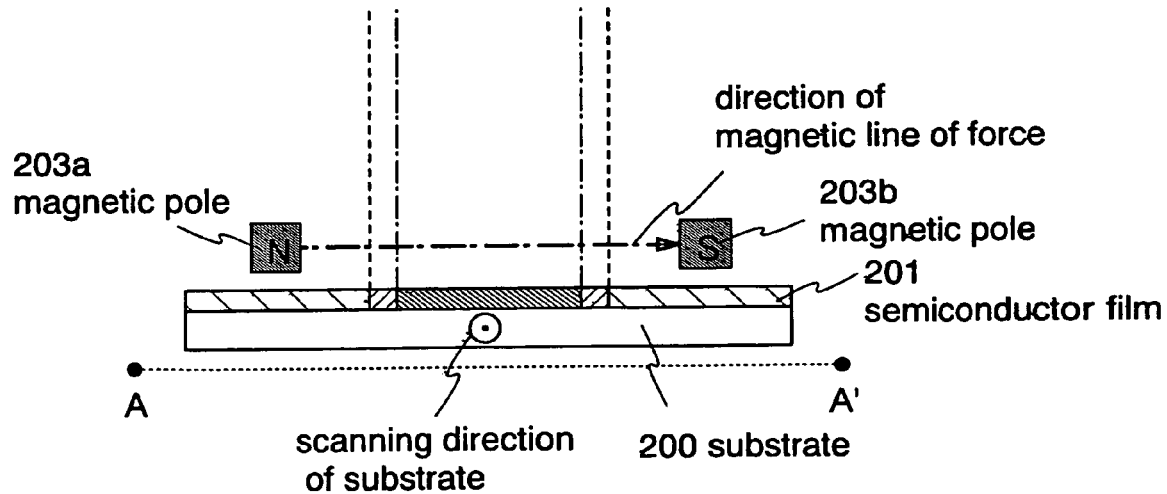

FIG. 3
(A)
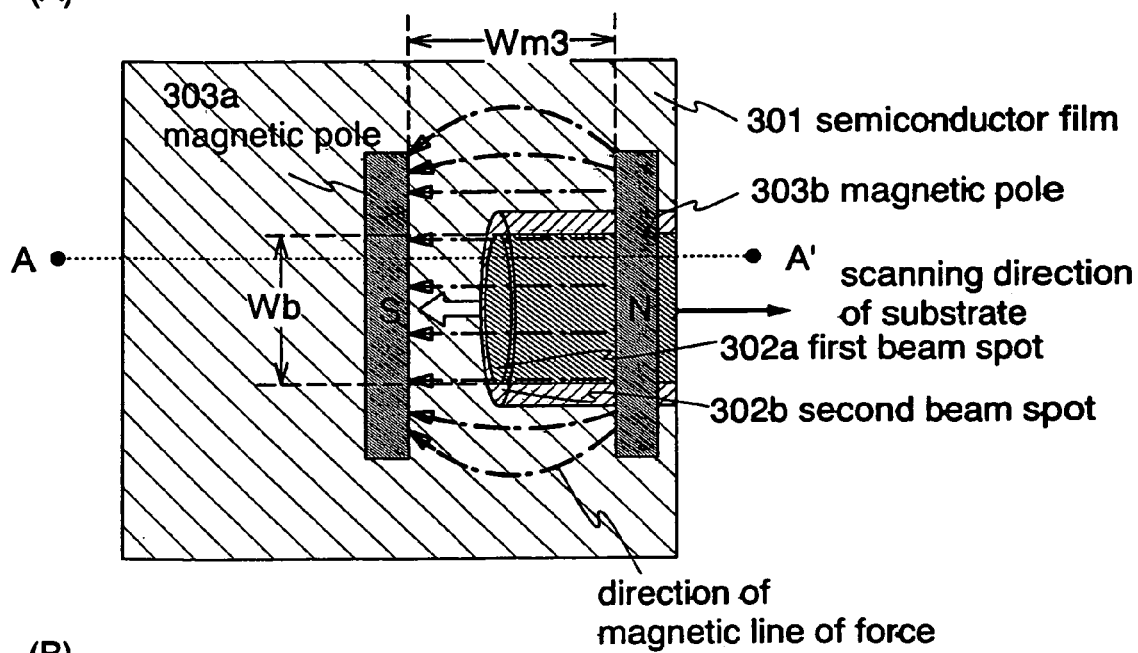
(B)
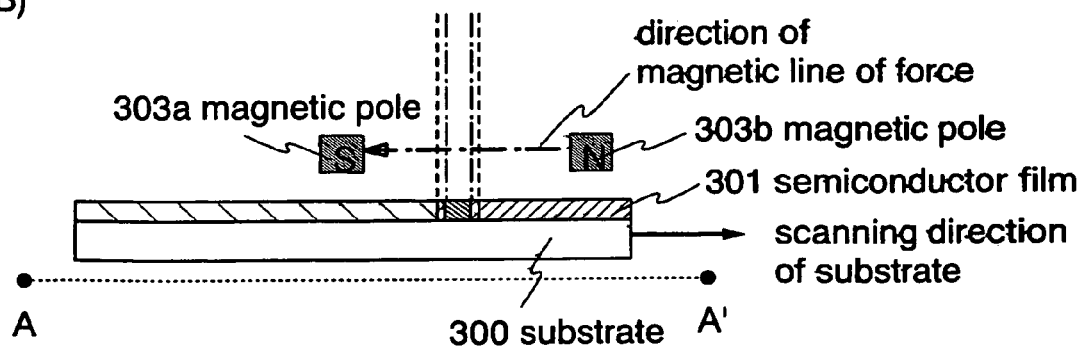

FIG. 4
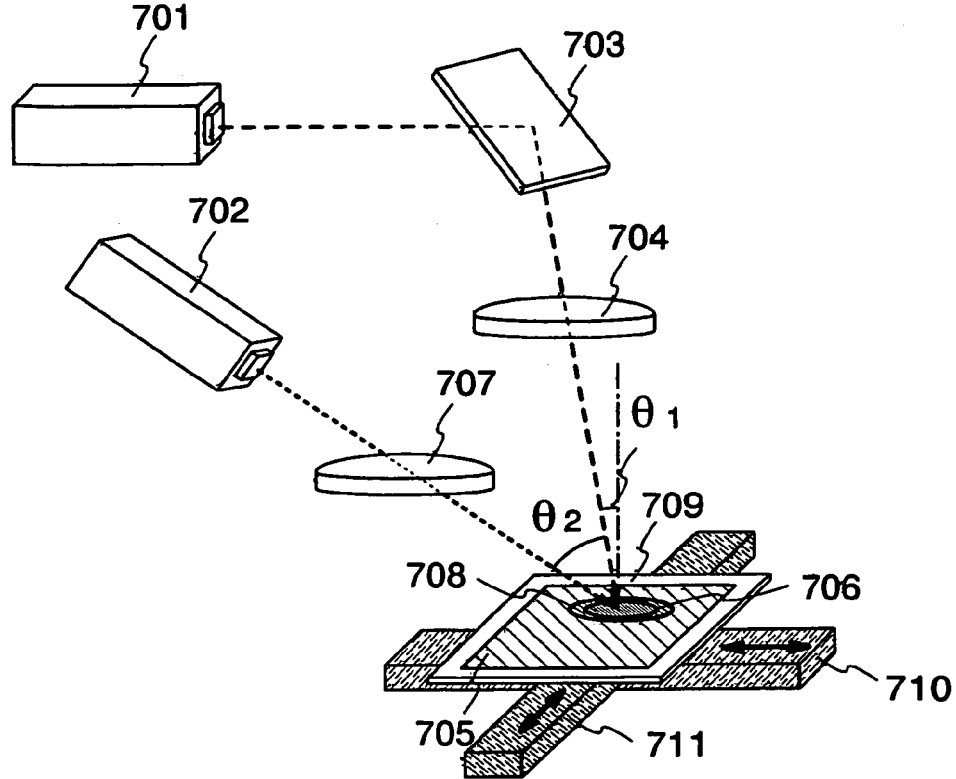
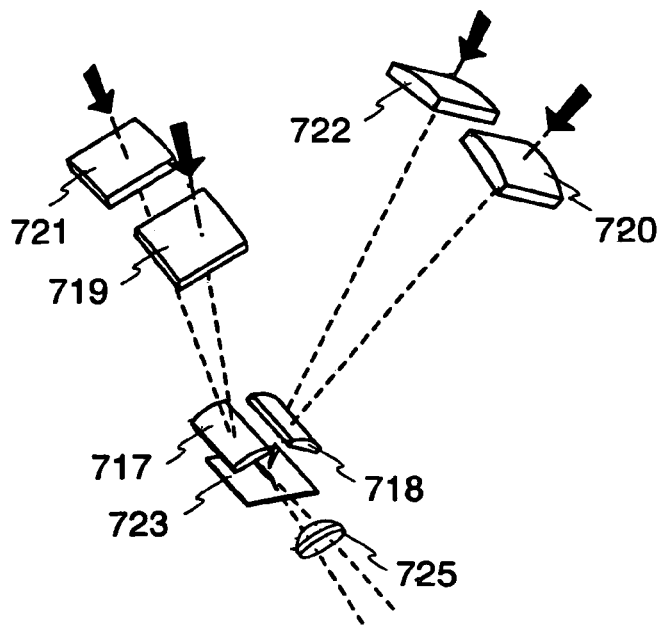

FIG. 11
(A)
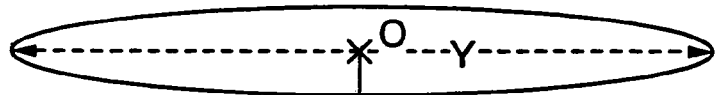
(B)
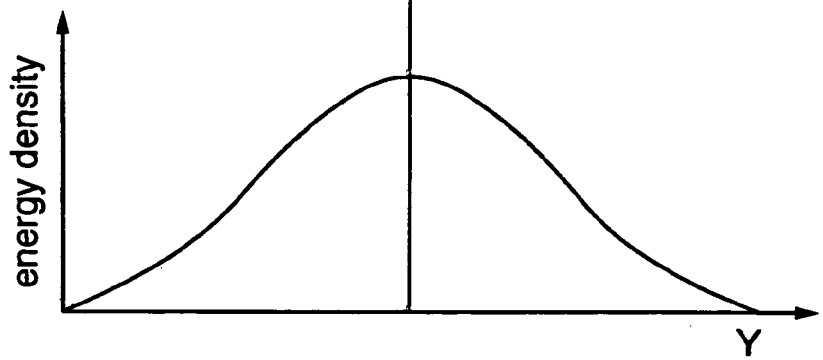
(C)
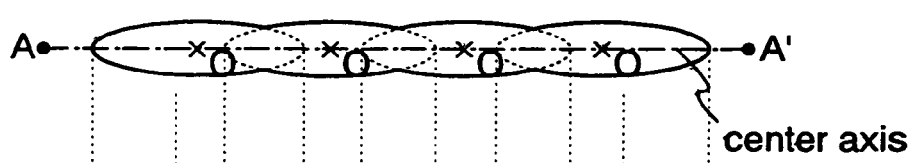
(D) energy density distribution between A-A'
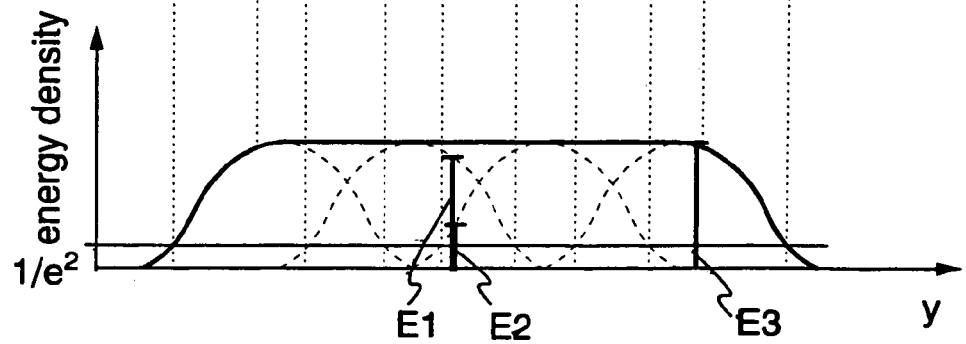

METHOD FOR MANUFACTURING A SEMICONDUCTOR DEVICE THAT INCLUDES ADDING NOBLE GAS TO A SEMICONDUCTOR FILM AND THEN IRRADIATING THE SEMICONDUCTOR FILM WITH LASER LIGHT IN THE PRESENCE OF A MAGNETIC FIELD

BACKGROUND OF THE INVENTION

1. Technical Field of the Invention

The present invention relates to a continuous wave laser irradiation apparatus utilized for crystallizing a semiconductor film. In addition, the present invention relates to a method for manufacturing a semiconductor device including a process for crystallizing the semiconductor film with the use of the laser irradiation apparatus.

2. Description of the Related Art

A thin film transistor using a polycrystalline semiconductor film (polycrystalline TFT) is superior to TFT using an amorphous semiconductor film in its mobility by double digits or more and has an advantage that a pixel portion and its peripheral driver circuit in a semiconductor display device can be integrally formed on the same substrate.

The polycrystalline semiconductor film can be formed over an inexpensive glass substrate when a laser annealing method is employed. However, the energy of the laser light output from the oscillator fluctuates by at least a few percentage points due to the various reasons. This fluctuation prevents the semiconductor film from being crystallized homogeneously. When the crystallinity of the polycrystalline semiconductor film varies due to the inhomogeneous crystallization, the characteristic of TFT using the polycrystalline semiconductor film as its active layer such as on-current or the mobility also varies.

For example, in the case of an active matrix light-emitting device with a light-emitting element and a TFT for controlling current supplied to the light-emitting element provided in each pixel, when the on-current of TFT varies, the luminance of the light-emitting element also varies accordingly.

Moreover, when the semiconductor film is crystallized by the irradiation of the laser light in the atmosphere, the surface of the semiconductor film becomes somewhat rough. The higher the energy intensity of the laser light is, the rougher the surface of this semiconductor film becomes. The light is scattered to give more brightness in the region whose surface is rougher. Therefore, sometimes the striped light and shade are visible at intervals of several mm due to the energy fluctuation.

It is noted that the state of the surface of the semiconductor film is closely related to the oxygen in the atmosphere when the laser light is irradiated according to the patent application shown below.

Published patent application No. 2000-138180 (P.3-P.4) describes that the more oxygen the atmosphere contains, the rougher the surface of the semiconductor film crystallized with the irradiation of the laser light becomes. The application also describes to spray the semiconductor film with Ar when the laser light is irradiated.

When the surface of the semiconductor film becomes rough, interface state density at the interface between the semiconductor film and a gate insulating film formed so as to contact the semiconductor film becomes high and the threshold voltage shifts to normally-off side. Therefore, when the state of the surface of the semiconductor film becomes uneven due to the energy fluctuation of the laser light, the interface state density at the interface between the semiconductor film and the gate insulating film formed afterward varies, which results in the variation of the threshold of TFT.

When the laser light having high absorption coefficient to the semiconductor film is employed, it is possible to crystallize the semiconductor film more effectively. The absorption coefficient depends on the material and the thickness of the semiconductor film. However, When a silicon film having a thickness from several tens nm to several hundreds nm which is usually used in the semiconductor device is crystallized by an excimer laser or a $YVO_4$ laser, the second harmonic having a shorter wavelength than the fundamental wave is higher in absorption coefficient and thereby it is possible to crystallize more effectively.

For this reason, in order to enhance the efficiency of the crystallization, the wavelength is usually converted through a non-linear optical element. The laser light converted into the harmonic, however, tends to have lower energy compared with the case of the fundamental wave. For example in the case of Nd: YAG laser, the conversion efficiency from the fundamental wave (wavelength: 1064 nm) to the second harmonic (wavelength: 532 nm) is approximately 50%. When the energy of the laser light decreases, the throughput in the crystallization also decreases, which results in the lowering of the productivity.

Moreover, since the non-linear optical element is easy to deteriorate due to the laser light and is inferior in endurance, when the energy of the fundamental wave is increased in order to obtain the laser light of the harmonic having high energy, it is necessary to do the maintenance frequently. Therefore, this is not preferable.

3. Problem Solved by the Invention

In view of the problem described above, it is an object of the present invention to provide a laser irradiation apparatus being able to suppress the unevenness of the crystallinity or the state of the surface of the semiconductor film and to perform homogeneous crystallization of the semiconductor film. It is another object of the present invention to provide a method for manufacturing a semiconductor device with the use of the laser irradiation apparatus being able to suppress the variation of the on-current, the mobility, and the threshold of TFT.

Furthermore, it is an object of the present invention to provide a laser irradiation method and a laser processing apparatus having high throughput in view of the problem described above.

SUMMARY OF THE INVENTION

The energy density of the laser light is assumed to have a very close relation with the crystallinity of the semiconductor film. However, the present inventors considered that such a wide variation of the crystallinity as causing the visible variation of the luminance cannot be explained only with the fluctuation of the energy density by a few percentage points. Therefore, the present inventors examined the secondary factor caused by the fluctuation of the energy density that affects the crystallinity.

The present inventors focused on a mixture of oxygen or nitrogen existing in the atmosphere into the semiconductor film melted by the laser light.

The semiconductor film melted instantaneously by the irradiation of the laser light seems to be recrystallized at a comparatively rapid rate of several tens m/s when irradiated with the pulsed laser light, and several cm/s when irradiated with the CW laser light. Therefore, it is assumed that the impurities exist in the air dissolve in the semiconductor film more than the solubility in thermal equilibrium state.

The irradiation time of the laser light for crystallizing the semiconductor film also depends on the scanning speed, and in the case of using the pulsed laser light, the irradiation time of the laser light ranges from several to several tens ns. On the other hand, in the case of using the CW laser light, the irradiation time is comparatively long in the range from several to several tens µs. Therefore, the CW laser light melts the semiconductor film longer than the pulsed laser light. For this reason, it is considered that the impurities in the air are easier to be mixed into the semiconductor film in the case of using the CW laser light.

The higher the temperature of the semiconductor film is, the more easily the impurities in the air dissolve in the semiconductor film, because the solubility of the gas increases. Therefore, it is assumed that when the heat given to the semiconductor film makes difference of elevation due to the fluctuation of the energy density, the impurity concentration in the semiconductor film varies.

Since the impurities such as oxygen or nitrogen mixed from the atmosphere are positive in segregation coefficient in the melted semiconductor film, they are easy to be segregated in the grain boundary at the time of recrystallization. This phenomenon is called grain boundary segregation and is more likely to be seen in the impurity whose solid solubility is lower. The segregated impurity such as oxygen or nitrogen is easy to combine with silicon to form the insulator such as silicon oxide, silicon nitride oxide, or silicon nitride. And the insulator segregated in the grain boundary prevents the carrier from moving in the semiconductor film and this causes the decreasing of the mobility.

Therefore, it is considered that the variation of the impurity concentration due to the fluctuation of the energy density causes the variation of the mobility of the semiconductor film.

Consequently, the present inventors tried to enhance the crystallinity by performing the following processes. Ar is doped in the semiconductor film before crystallizing it with the irradiation of the laser light, and then the semiconductor film is irradiated with the laser light in the atmosphere of Ar. It is noted that the element to be doped is not limited to Ar and any other zeroth group elements (noble gas element) may be employed. Moreover, when the laser light is irradiated, Ar is not always necessary in the atmosphere, and the gas of the zeroth group element or the gas of the zeroth group element added with hydrogen may be employed. The zeroth group element is appropriate in point of that the zeroth group element does not become a dopant because it is neutral in the semiconductor film, and that the zeroth group element is hard to form the compound with the element constituting the semiconductor typified by silicon. Particularly, since Ar is inexpensive, the cost required for manufacturing a semiconductor device can be reduced. It is noted that not only an ion doping method but also an ion implantation method may be employed as means for adding the zeroth group element to the semiconductor film.

The processes from doping Ar up to irradiating the laser light to the semiconductor film are performed in the load lock system chamber in order not to expose the semiconductor film in the atmosphere including oxygen. For example, with the manufacturing apparatus of the multi-chamber system including a chamber to perform the process to form a semiconductor film, a chamber to perform the process to dope Ar to the semiconductor film, and a chamber to irradiate the semiconductor film with the laser light, it is possible to perform a series of processes in order without exposing the semiconductor film to the atmosphere.

The mass of the gas that can dissolve in a certain amount of liquid is in proportion to the partial pressure of the gas contacting the liquid. Therefore, when the semiconductor film is doped with Ar or the like in advance and then it is irradiated with the laser light in the atmosphere of Ar or the like, it is possible to prevent oxygen and nitrogen from mixing into the semiconductor film from the atmosphere effectively.

Therefore, it is possible to suppress the variation of the impurity concentration due to the fluctuation of the energy density, and to suppress the variation of the mobility of the semiconductor film. In TFT formed by using the semiconductor film, it is also possible to suppress the variation of the on-current in addition to the mobility.

As described in patent application No. 2000-138180, empirically, when the laser light is irradiated in the atmosphere including oxygen, the surface of the semiconductor film becomes rough. With the composition of the present invention, however, it is possible to suppress the roughness of the semiconductor surface due to the irradiation of the laser light and to suppress the variation of the threshold caused by the variation of the interface state density.

In addition, when the semiconductor film melts, it is considered that a flow is generated in the semiconductor film due to the temperature gradient or the difference of the surface tension. The present inventors considered that the impurities such as oxygen or nitrogen mixed from the surface of the semiconductor film are distributed in such a way that the impurity is inclined locally due to the flow. The irregularity of the flow in the semiconductor film increases with the temperature of the semiconductor film. As a result, since the impurities are dissolved again microscopically in recrystallization, the interface between the solid phase and the liquid phase becomes inhomogeneous, and thereby the impurities are inclined irregularly.

Consequently in the present invention, a magnetic field is applied to the semiconductor film when the laser light is irradiated in order to suppress the flow. Silicon is semiconductor in a solid phase. On the other hand, it is conductive material in a liquid phase. When the magnetic field is applied to the conductive material, the current is generated inside the conductor moving across the magnetic line of force according to Fleming's law, and the conductive material receives a force from a direction opposite to the moving direction by this current. As a result, the viscosity increases to suppress the flow. Therefore, the segregation of the impurities due to the flow can be suppressed and the variation of the mobility and the on-current can be also suppressed.

In addition, it is also considered that when the viscosity of the semiconductor film increases by applying the magnetic field, it is possible to prevent the impurities from mixing into the semiconductor film and to increase the mobility of the semiconductor film more.

It is noted that the magnetic field may be applied by electromagnetic induction with a coil or the like, or may be applied by a permanent magnet. As the permanent magnet, a neodymium magnet, a samarium-cobalt magnet, an anisotropic ferrite magnet, an isotropic ferrite magnet, an alnico magnet, a NdFeB bonded magnet, or the like can be used.

It is noted that in the present invention, the semiconductor film may be irradiated with the laser light after the catalyst element is added thereto so as to enhance the crystallinity.

Moreover, in the present invention, a first laser light converted into the harmonic, which is easy to be absorbed in the semiconductor film, and a second laser light having the fundamental wave are irradiated simultaneously to the semiconductor film in order to crystallize it. Specifically, the first laser light has a shorter wavelength than the visible light.

In the present invention, the first laser light converted into the harmonic which is easy to be absorbed in the semiconductor film is irradiated to melt the semiconductor film and to increase the absorption coefficient of the fundamental wave. When the second laser light having a wavelength of the fundamental wave is irradiated in such a state, the semiconductor film in which the absorption coefficient of the fundamental wave is increased absorbs the second laser light effectively, and thereby it is possible to enhance the throughput of the laser crystallization.

Since the wavelength of the second laser light does not need to be converted, it is not necessary to suppress the energy in consideration of deterioration of the non-linear optical element. For example, the second laser light can have 100 times or more output than the first laser light. Therefore, it is no longer necessary to do the troublesome maintenance of the non-linear optical element, which can enhance the total energy of the laser light absorbed in the semiconductor film and a larger crystal grain can be obtained.

It is noted that the number of laser light is not limited to two, and the number thereof may be two or more. A plurality of the laser light having a wavelength of the harmonic may be employed. In addition, a plurality of the second laser light having a wavelength of the fundamental wave may be also employed.

Furthermore, with the irradiation of the fundamental wave, it is possible to provide advantageous effects that the sharp fall in the temperature of the semiconductor film in the laser crystallization is suppressed and that the crystal grows so as to have a larger sized grain in addition to the advantageous effect that the energy of the harmonic is assisted.

BRIEF DESCRIPTION OF THE DRAWINGS

FIG. 2 shows the relation between the direction of the magnetic line of force and the scanning direction of the beam spot and the substrate in the laser irradiation apparatus of the present invention.

FIG. 3 shows the relation between the direction of the magnetic line of force and the scanning direction of the beam spot and the substrate in the laser irradiation apparatus of the present invention.

FIG. 4 shows the structure of the optical system in the laser irradiation apparatus of the present invention.

FIG. 11 shows energy density distribution of the beam spot.

DETAILED DESCRIPTION OF THE PREFERRED EMBODIMENTS

Embodiment Modes

Embodiment Mode 1

Figure 1:
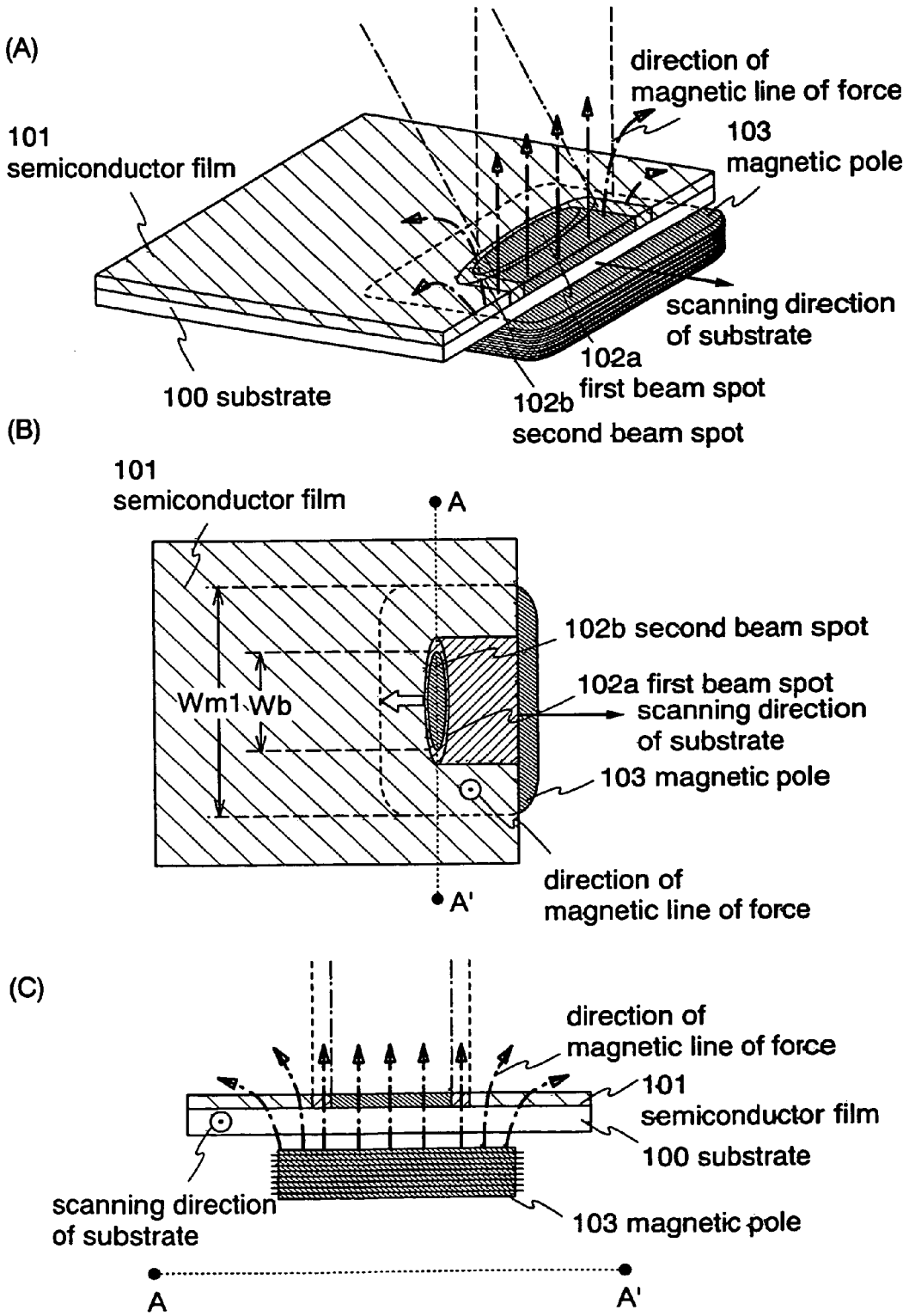
FIG. 1 shows the relation between the direction of the magnetic line of force and the scanning direction of the beam spot and the substrate in the laser irradiation apparatus of the present invention.

A laser irradiation method of the present invention is explained with reference to FIG. 1. FIG. 1(A) shows an aspect in which a semiconductor film 101 formed over a substrate 100 is irradiated with laser light. In the present invention, the semiconductor film 101 is doped with the zeroth group element which is hard to form a compound with the semiconductor and which is neutral in the semiconductor film so that it does not function as a dopant before the crystallization by the irradiation of the laser light.

He, Ne, Ar, Kr, Xe, or the like is given as the zeroth group element to be doped. As well as the doping of P and B imparting conductivity to the semiconductor film, the zeroth group element can be doped by converting it into plasma and accelerating it with a porous electrode. Unlike P and B restricted legally, the gas to be doped does not have to be diluted with hydrogen and thereby the throughput is high.

For example, in the case of Ar, Ar is doped so that the concentration in the semiconductor film ranges from $1\times10^{18}$ atoms/cm$^3$ to $1\times10^{21}$ atoms/cm$^3$, preferably from $5\times10^{18}$ atoms/cm$^3$ to $5\times10^{20}$ atoms/cm$^3$. The accelerating voltage affects the concentration distribution of Ar in a direction of the thickness of the semiconductor film 101. Therefore, the acceleration voltage is determined appropriately by the condition in which the concentration is made higher toward the surface side of the film, the concentration is made higher toward the substrate side of the film, or the concentration is made uniform all over the film.

In addition, the semiconductor film 101 is irradiated with the laser light in the atmosphere of the zeroth group element described above. It is noted that the zeroth group element doped in the semiconductor film and the zeroth group element used when the laser light is irradiated do not always have to be the same.

It is noted that the laser light may be irradiated in the atmosphere of the gas of the zeroth group element added with hydrogen. In this case, the partial pressure of hydrogen is set in the range of 1 to 3%.

In FIG. 1(A), a reference numeral 102a denotes the first beam spot obtained by the first laser light having a wavelength of the harmonic irradiated to the semiconductor film 101. A reference numeral 102b denotes the second beam spot obtained by the second laser light having a wavelength of the fundamental wave irradiated to the semiconductor film 101.

The first laser light or the second laser light is emitted from a continuous wave gas laser, solid laser, or metal laser. As the gas laser, an Ar laser, a Kr laser, a XeF excimer laser, a CO$_2$ laser, and the like are given. As the solid laser, a YAG laser, a YVO$_4$ laser, a YLF laser, a YalO$_3$ laser, a glass laser, a ruby laser, an alexandrite laser, a Ti: Sapphire laser, and the like are given. As the metal laser, a helium-cadmium laser, a copper vapor laser, a gold vapor laser, and the like are given.

The wavelength of the first laser light is converted into the second harmonic to the fourth harmonic through the non-linear optical element. Since the wavelength of the harmonic depends on the kind of the laser for use, the harmonic is selected appropriately according to the laser. For example, in the case of Nd: YVO$_4$ laser (wavelength: 1064 nm), it is desirable to employ the second harmonic (532 nm) or the third harmonic (355 nm). Specifically, the laser light emitted from the CW YVO$_4$ laser is converted into the harmonic with an output of 10 W through the non-linear optical element.

It is noted that the non-linear optical element may be provided inside the resonator included in the oscillator or the resonator equipped with the non-linear optical element may be provided separately aside from the resonator of the fundamental wave. The former structure has an advantage that the apparatus can be made small and thereby the accurate control of the resonator length is not necessary any more. On the other hand, the latter structure has an advantage that the interaction of the fundamental wave and the harmonic can be ignored.

As the non-linear optical element, the crystal whose non-linear optical constant is relatively large such as KTP (KTiOPO$_4$), BBO (β-BaB$_2$O$_4$), LBO (LiB$_3$O$_5$), CLBO (CsLiB$_6$O$_{10}$), GdYCOB (YCa$_4$O(BO$_3$)$_3$), KDP (KD$_2$PO$_4$), KB5, LiNbO$_3$, Ba$_2$NaNb$_5$O$_{15}$ or the like is used. Especially, the crystal such as LBO, CLBO, or the like can enhance conversion efficiency from the fundamental wave into the harmonic.

It is desirable that the first laser light and the second laser light are TEM$_{00}$ mode (single mode) obtained from the stable resonator. In the case of TEM$_{00}$ mode, the beam spot is easily processed because the laser light has Gaussian intensity distribution and it is superior in light converging.

The positions of the first beam spot 102a and the second beam spot 102b are controlled so as to overlap each other. Therefore, the part of the semiconductor film 101 irradiated with the beam spot 102a is melted by the first laser light and the absorption coefficient increases. For this reason, the second laser light is absorbed in the semiconductor film effectively in the part overlapped with the first beam spot 102a and the second beam spot 102b. Thus the throughput can be enhanced in the process of crystallization.

It is noted that the first laser light and the second laser light do not always have to be emitted from the same laser. For example, the first laser light may be emitted from the Nd:YVO$_4$ laser generating the second harmonic having an output of 10 W, and the second laser light may be emitted from the YAG laser having an output of 30 W. Of course, the present invention is not limited to this combination.

When the substrate 101 is scanned to the direction indicated by an arrow of a continuous line, the relative positions of the first beam spot 102a and the second beam spot 102b to the semiconductor film 101 move.

A reference numeral 103 denotes a magnetic pole of a magnetic circuit being able to apply a magnetic field to the semiconductor film 101, particularly to the part thereof overlapped with the first beam spot 102a and the second beam spot 102b. A magnetic line of force of the magnetic field generated from the magnetic pole 103 is shown with an arrow of a dotted line.

In order to clarify the relation between the direction of the magnetic line of force and the scanning direction of the substrate to the semiconductor film 101, FIG. 1(B) shows a top view of the semiconductor film 101, and FIG. 1(C) shows a cross-sectional view taken along a dotted line A-A' in FIG. 1(B). In FIG. 1, the scanning direction of the substrate 100 exists in the surface of the substrate 100 as shown with an arrow of a continuous line. The relative positions of the first beam spot 102a and the second beam spot 102b to the semiconductor film 101 move to the direction indicated by the white arrow by the scanning of the substrate 100.

The magnetic pole 103 is provided in the side of the substrate 100 opposite to the side thereof irradiated with the laser light. And the magnetic line of force is directed to the surface of the semiconductor film 101 from the magnetic pole 103.

It is noted that the surface formed with the semiconductor film 101 is not always perpendicular to the direction of the magnetic line of force. In the present invention, it does not lead to any problems as long as the magnetic component in which the direction of passing magnetic line of force is almost constant is applied in the part of the semiconductor film 101 overlapped with the first beam spot 102a and the second beam spot 102b.

And the magnetic flux density in the part of the semiconductor film 101 overlapped with the first beam spot 102a and the second beam spot 102b is set in the range of 1000 G to 10000 G, preferably in the range of 1500 G to 4000 G.

FIG. 1 shows a case in which a surface formed with the semiconductor film 101 is perpendicular to the direction of the magnetic line of force in the part of the semiconductor film 101 overlapped with the first beam spot 102a and the second beam spot 102b. In this case, the scanning direction of the substrate 100 and the direction of the magnetic line of force are also perpendicular. The direction of the magnetic line of force, however, is not limited to that shown in the FIG. 1.

It is noted that in order to prevent the total energy of the laser light absorbed in the semiconductor film from being different in the part overlapped with the first beam spot 102a and the second beam spot 102b and in the part not overlapped, it is the most preferable that the first beam spot 102a is overlapped with the second beam spot 102b completely. In order to raise the proportion of the region having homogeneous energy density in the first beam spot 102a, it is desirable that the first beam spot 102a has a linear shape, a rectangular shape, or an elliptical shape in which a ratio of the length of the major axis to that of the minor axis is five or more.

In this embodiment mode, as shown in the FIG. 1(B), Wb, which is the length of the first beam spot 102a in the direction of its major axis, is made shorter than W$_{m1}$, which is the width of the magnetic pole 103 in the direction of the major axis of the first beam spot 102a, so that the direction of passing magnetic line of force can be kept almost constant in the part of the semiconductor film 101 irradiated with the first beam spot 102a, more preferably in the part overlapped with the first beam spot 102a and the second beam spot 102b.

In the present invention, as described above, oxygen or nitrogen can be prevented from mixing into the semiconductor film effectively by doping Ar or the like in the semiconductor film in advance and by irradiating the laser light in the atmosphere of Ar or the like. Therefore, the variation of the impurity concentration due to the fluctuation of the energy density can be suppressed. Moreover, the variation of the mobility of the semiconductor film can be suppressed. And in TFT formed using the semiconductor film, the variation of the on-current in addition to the mobility can be suppressed.

As described in patent application No. 2000-138180, empirically, when the laser light is irradiated in the atmosphere including oxygen, the surface of the semiconductor film becomes rough. However, when the laser light is irradiated in the atmosphere of Ar or the like, such roughness can be suppressed, and the variation of the threshold due to the variation of the interface state density can be suppressed.

Furthermore, when the magnetic field is applied to the semiconductor film at the time of laser irradiation, the segregation of the impurities due to the flow can be suppressed. By further applying the magnetic field, the viscosity of the semiconductor film can be increased, and thereby the impurities are prevented from mixing into the semiconductor film. As a result, it is possible to suppress the variation of the mobility and the on-current.

In addition, in the present invention, the semiconductor film is melted with the irradiation of the first laser light converted into the harmonic that is easy to be absorbed in the semiconductor film and the absorption coefficient of the fundamental wave is increased. When the second laser light having the fundamental wave is irradiated in such a state, the second laser light can be absorbed effectively in the semiconductor film in which the absorption coefficient of the fundamental wave is increased. Therefore, the throughput of the laser crystallization can be enhanced.

Embodiment Mode 2

This embodiment mode explains one mode of the present invention in which the magnetic field is applied to the different direction from that in the case of FIG. 1.

FIG. 2(A) is a top view of a semiconductor film 201 and FIG. 2(B) is a cross-sectional view taken along a dotted line A-A' in FIG. 2(A). It is noted that a reference numeral 201 denotes the semiconductor film formed over a substrate 200 in FIG. 2(A) and FIG. 2(B).

The scanning direction of the substrate 200 exists in the surface of the substrate 200 as indicated by an arrow of a continuous line. In addition, a reference numeral 202a denotes the first beam spot obtained by the first laser light having a wavelength of the harmonic irradiated to the semiconductor film 202. A reference numeral 202b denotes the second beam spot obtained by the second laser light having a wavelength of the fundamental wave irradiated to the semiconductor film 202.

The first laser light and the second laser light are emitted from the CW gas laser, solid laser, or metal laser. The lasers cited in the embodiment mode 1 can be employed, for example.

The wavelength of the first laser light is converted from the fundamental wave to the second harmonic, the third harmonic, or the fourth harmonic through the non-linear optical element. Since the wavelength of the harmonic depends on the kind of the laser, the appropriate harmonic is selected according to the laser to be used. The crystals cited in the embodiment mode 1 can be used as the non-linear optical element, for example.

It is desirable that the first laser light and the second laser light are $TEM_{00}$ mode (single mode) obtained from the stable resonator. In the case of $TEM_{00}$ mode, the beam spot is easily processed because the laser light has Gaussian intensity distribution and it is superior in the light converging.

The positions of the first beam spot 202a and the second beam spot 202b are controlled so as to overlap each other. Therefore, the part of the semiconductor film 201 irradiated with the first beam spot 202a is melted by the first laser light and the absorption coefficient increases. For this reason, the second laser light is absorbed in the semiconductor film 201 effectively in the part overlapped with the first beam spot 202a and the second beam spot 202b. Thus, the throughput in the process of the crystallization can be enhanced.

When the substrate 200 is scanned to the direction indicated by an arrow of a continuous line, the relative positions of the first beam spot 202a and the second beam spot 202b to the semiconductor film 201 move to the direction indicated by a white arrow.

Magnetic poles 203a and 203b correspond to the magnetic poles of the magnetic circuit being able to apply the magnetic field to the semiconductor film 201, particularly to the part overlapped with the first beam spot 202a and the second beam spot 202b. The magnetic line of force of the magnetic field generated between the magnetic poles 203a and 203b is shown with an arrow of a dotted line. The magnetic poles 203a and 203b are provided in both sides of the substrate 200 irradiated with the laser light, and the direction of the magnetic line of force exists in the surface of the semiconductor film 201. In FIG. 2, the scanning direction of the substrate 200 is perpendicular to the direction of the magnetic line of force in the part of the semiconductor film 201 overlapped with the first beam spot 202a and the second beam spot 202b.

It is noted that the magnetic line of force is distributed as connecting the magnetic poles 203a and 203b. The magnetic line of force is almost straight in the space where the distance from the magnetic poles 203a and 203b is shorter, but is curved to have a larger curvature as the distance is longer. Therefore, the scanning direction of the substrate 200 and the direction of the magnetic line of force are not always perpendicular. In the present invention, it does not lead to any problems as long as the magnetic component in which the direction of passing magnetic line of force is almost constant is applied in the part of the semiconductor film 201 overlapped with the first beam spot 202a and the second beam spot 202b.

The magnetic flux density in the part of the semiconductor film 201 overlapped with the first beam spot 202a and the second beam spot 202b is set in the range of 1000 G to 10000 G, preferably in the range of 1500 G to 4000 G.

It is noted that in order to prevent the total energy of the laser light absorbed in the semiconductor film from being different in the part overlapped with the first beam spot 202a and the second beam spot 202b and in the part not overlapped, it is the most preferable that the first beam spot 202a is overlapped with the second beam spot 202b completely. In order to raise the proportion of the region having homogeneous energy density in the first beam spot 202a, it is desirable that the first beam spot 202a has a linear shape, a rectangular shape, or an elliptical shape in which a ratio of the length of the major axis to that of the minor axis is five or more.

In this embodiment mode, as shown in the FIG. 2(A), Wb, which is the length of the first beam spot 202a in the direction of its major axis, is made shorter than $W_{m2}$, which is the distance between the magnetic poles 203a and 203b, so that the direction of passing magnetic line of force can be kept almost constant in the part of the semiconductor film 201 irradiated by the first beam spot 202a, more preferably in the part overlapped with the first beam spot 202a and the second beam spot 202b.

The amount of the applied magnetic field can be adjusted with the width of $Wm_2$. $Wm_2$ is preferably in the range of 1 mm to 5 mm.

Embodiment Mode 3

This embodiment mode explains one mode of the present invention in which the magnetic field is applied to the direction different from those in the case of FIG. 1 and FIG. 2.

FIG. 3(A) is a top view of a semiconductor film 301 and FIG. 3(B) is a cross-sectional view taken along a dotted line A-A' in FIG. 3(A). It is noted that a reference numeral 301 denotes the semiconductor film formed over a substrate 300 in FIGS. 3(A) and 3(B).

The scanning direction of the substrate 300 exists in the surface of the substrate 300 as indicated by an arrow of a continuous line. In addition, a reference numeral 302a denotes the first beam spot obtained by the first laser light having a wavelength of the harmonic irradiated to the semiconductor film 302. A reference numeral 302b denotes the second beam spot obtained by the second laser light having a wavelength of the fundamental wave irradiated to the semiconductor film 302.

The first laser light and the second laser light are emitted from the CW gas laser, solid laser, or metal laser. The lasers cited in the embodiment mode 1 can be employed, for example.

The wavelength of the first laser light is converted from the fundamental wave to the second harmonic, the third harmonic, or the fourth harmonic through the non-linear optical element. Since the wavelength of the harmonic depends on the kind of the laser, the appropriate harmonic is selected according to the laser to be used. The crystals cited in the embodiment mode 1 can be used as the non-linear optical element, for example.

It is desirable that the first laser light and the second laser light are TEM$_{00}$ mode (single mode) obtained from the stable resonator. In the case of TEM$_{00}$ mode, the beam spot is easily processed because the laser light has Gaussian intensity distribution and is superior in the light converging.

The positions of the first beam spot 302a and the second beam spot 302b are controlled so as to overlap each other. Therefore, the part of the semiconductor film 301 irradiated with the first beam spot 302a is melted by the first laser light and the absorption coefficient increases. For this reason, the second laser light is absorbed in the semiconductor film 301 effectively in the part overlapped with the first beam spot 302a and the second beam spot 302b. Thus the throughput in the process of the crystallization can be enhanced.

When the substrate 300 is scanned to the direction indicated by an arrow of a continuous line, the relative positions of the first beam spot 302a and the second beam spot 302b to the semiconductor film 301 move to the direction indicated by a white arrow.

Magnetic poles 303a and 303b correspond to the magnetic poles of the magnetic circuit being able to apply the magnetic field to the semiconductor film 301, particularly to the part overlapped with the first beam spot 302a and the second beam spot 302b. The magnetic line of force of the magnetic field generated between the magnetic poles 303a and 303b is shown with an arrow of a dotted line. The magnetic poles 303a and 303b are provided in both sides of the substrate 300 irradiated with the laser light, and the direction of the magnetic line of force exists in the surface of the semiconductor film 301. In FIG. 3, the scanning direction of the substrate 300 is parallel to and opposite to the direction of the magnetic line of force in the part of the semiconductor film 301 overlapped with the first beam spot 302a and the second beam spot 302b.

It is noted that the magnetic line of force is distributed as connecting the magnetic poles 303a and 303b. The magnetic line of force is almost straight in the space where the distance from the magnetic poles 303a and 303b is shorter, but is curved to have a larger curvature as the distance is longer. Therefore, the scanning direction of the substrate 300 and the direction of the magnetic line of force are not always parallel. In the present invention, it does not lead to any problems as long as the magnetic component in which the direction of passing magnetic line of force is almost constant is applied in the part of the semiconductor film 301 overlapped with the first beam spot 302a and the second beam spot 302b.

The magnetic flux density in the part of the semiconductor film 301 overlapped with the first beam spot 302a and the second beam spot 302b is set in the range of 1000 G to 10000 G, preferably in the range of 1500 G to 4000 G It is noted that in order to prevent the total energy of the laser light absorbed in the semiconductor film from being different in the part overlapped with the first beam spot 302a and the second beam spot 302b and in the part not overlapped, it is the most preferable that the first beam spot 302a is overlapped with the second beam spot 302b completely. In order to raise the proportion of the region having homogeneous energy density in the first beam spot 302a, it is desirable that the first beam spot 302a has a linear shape, a rectangular shape, or an elliptical shape in which a ratio of the length of the major axis to that of the minor axis is five or more.

In this embodiment mode, as shown in the FIG. 3(A), Wb, which is the length of the first beam spot 302a in the direction of its major axis, is made shorter than W$_{m3}$, which is the distance between the magnetic poles 303a and 303b, so that the direction of passing magnetic line of force can be kept almost constant in the part of the semiconductor film 301 irradiated with the first beam spot 302a, more preferably in the part overlapped with the first beam spot 302a and the second beam spot 302b.

The amount of the applied magnetic field can be adjusted with the width of Wm$_3$. Wm$_3$ is preferably in the range of 1 mm to 5 mm.

It is noted that as the method for scanning laser light, there are an irradiation system moving type method in which a substrate, a processed object, is fixed while an irradiation position of laser light is moved, an processed object moving type method in which an irradiation position of the laser light is fixed while a substrate is moved, and a method in which these two methods are combined.

In the embodiment modes 1 to 3, the case in which the laser irradiation apparatus with the processed object moving type method was explained, but the present invention is not limited to this. The present invention can be applied to the laser irradiation apparatus with the irradiation system moving type and to the laser irradiation apparatus in which an processed object moving type and an irradiation system moving type are combined. In any case, it is premised that the relation between the moving direction of the beam spot relative to the semiconductor film and the direction of the magnetic line of force can be controlled.

In addition, although the embodiment modes 1 to 3 employ the magnetic field generated between the heterogeneous magnetic poles attracting each other, the present invention is not limited to this. The magnetic field generated between the homogeneous magnetic poles repelling each other may be also employed. For example, when the homogeneous magnetic poles are employed as the magnetic poles 203a and 203b in FIG. 2, the magnetic field can be applied in the direction perpendicular to the semiconductor film 201.

It is noted that the direction of the magnetic line of force is not limited to those shown in the embodiment modes 1 to 3. The direction thereof may be opposite to those shown in the embodiment modes 1 to 3, and the magnetic line of force may be directed to have an angle so as to be neither perpendicular nor parallel to the scanning direction of the laser light and to the semiconductor film.

Embodiment Mode 4

This embodiment mode explains a structure of the optical system included in the laser irradiation apparatus of the present invention.

FIG. 4(A) shows an example of the optical system for performing the laser crystallization with the use of the first laser light having a wavelength of the harmonic and the second laser light having a wavelength of the fundamental wave. A reference numeral 701 denotes a laser oscillator oscillating the first laser light. The CW Nd: YVO$_4$ laser having the second harmonic (wavelength 532 nm) with an output of 10 W is used in FIG. 4(A). Although the second harmonic is used in FIG. 4(A), the present invention is not limited to this, and the other higher harmonics can be employed. However, the higher the harmonic is, the lower the conversion efficiency becomes. In addition, when the wavelength is too short, the laser light transmits through the semiconductor film having a thickness in nanometers to micrometers, which results in the lowering of the crystallization efficiency. Therefore, it is preferable to employ the second harmonic.

A reference numeral 702 denotes a laser oscillator oscillating the second laser light. The CW Nd: YAG laser having the fundamental wave (wavelength 1.064 μm) with an output of 30 W is used in FIG. 4(A). The first and the second laser light obtained from the laser oscillators 701 and 702 are preferably TEM$_{00}$ mode (single mode).

After the first laser light oscillated from the laser oscillator 701 is reflected on a mirror 703, it is converged through a planoconvex lens 704. And then the first laser light is irradiated to a semiconductor film 705 formed over a substrate. A reference numeral 706 denotes the first beam spot formed on the semiconductor film 705 by the irradiation of the first laser light.

It is noted that an incidence angle $\theta 1$ of the first laser light to the semiconductor film 705 is set to 20° in this embodiment mode. The incidence angle $\theta 1$ is not limited to this, and it can be changed appropriately. The planoconvex lens 704 has a focal length of 20 mm, and the plane portion thereof is kept parallel to the surface of the semiconductor film 705. Moreover, the distance between the semiconductor film 705 and the planoconvex lens 704 is set to approximately 20 mm. This forms the first beam spot 706 having a size of approximately 500 μm in its major axis and approximately 20 μm in its minor axis and having a shape similar to ellipse.

On the other hand, the second laser light oscillated from the laser oscillator 702 is converged through a planoconvex lens 707 and then is irradiated to the semiconductor film 705 formed over the substrate. A reference numeral 708 denotes the second beam spot formed on the semiconductor film 705 by the irradiation of the second laser light.

The incidence angle $\theta_2$ of the second laser light to the semiconductor film 705 is set to 40° in this embodiment mode. The incidence angle $\theta_2$ is not limited to this, and it can be changed appropriately. The planoconvex lens 707 has a focal length of 15 mm, and the plane portion thereof is kept parallel to the surface of the semiconductor film 705. This forms the second beam spot 708 having a size of approximately 1 mm in its major axis and approximately 0.2 mm in its minor axis and having a shape similar to ellipse.

The first beam spot 706 and the second beam spot 708 are completely overlapped. A stage 709 can move to XY directions on the surface parallel to the surface of the semiconductor film 705 using a uniaxial robot for X-axis 710 and a uniaxial robot for Y-axis 711. It is appropriate that the scanning rate ranges from several tens cm/s to several hundreds cm/s and it is set to 50 cm/s here.

Next, another example of the optical system included in the laser irradiation apparatus of the present invention is explained.

In FIG. 4(B), laser light output from four laser oscillators are combined to form the first laser light to be used. In FIG. 4(B), four of the CW Nd:YVO$_4$ lasers each of which has an output of 10 W and has a wavelength of the second harmonic (532 nm) are used to form the first laser light. It is noted that although the second harmonic is used in this embodiment mode, the present invention is not limited to this and the other higher harmonics can be used.

Four of the first laser light being incident from the direction indicated by an arrow are incident into four cylindrical lenses 719 to 722 respectively. The two laser light shaped through the cylindrical lenses 719 and 721 make again the form of the beam spots through the cylindrical lens 717 and then the formed beam spots are irradiated to the substrate 723 with the semiconductor film formed thereover. On the other hand, the two laser light shaped through the cylindrical lenses 720 and 722 make again the form of the beam spots through the cylindrical lens 718, and then the formed beam spots are irradiated to the substrate 723.

It is possible for a designer to determine the focal length of each lens and the incidence angle appropriately. However, the focal length of the cylindrical lenses 717 and 718, which are positioned closest to the substrate 723, is made shorter than those of the cylindrical lenses 719 to 722. For example, the focal lengths of the cylindrical lenses 717 and 718, which are positioned closest to the substrate 723, are set to 20 mm. And the focal lengths of the cylindrical lenses 719 to 722 are set to 150 mm. Each lens is arranged so that the incidence angle of the laser light from the cylindrical lenses 717 and 718 to the processed object 700 is 25° and the incidence angle of the laser light from the cylindrical lenses 719 to 722 to the cylindrical lenses 717 and 718 is 10°.

Each of the beam spots of the first laser light on the substrate 723 overlaps partially one another to be combined so as to form the first beam spot. The first beam spot is shaped into the elliptical having a size of approximately 400 μm in its major axis and approximately 20 μm in its minor axis.

The second laser light can be obtained from the laser oscillator with an output of 500 W. The CW Nd:YAG laser having a wavelength of the fundamental wave (1.064 μm) is used as the laser oscillator. The first and the second laser light obtained from the laser oscillators 701 and 702 are preferably TEM$_{00}$ mode (single mode).

The second laser light is converged through a planoconvex lens 725 and is irradiated to the semiconductor film formed over the substrate 723. It is noted that instead of the planoconvex lens 725, two cylindrical lenses may be employed in such a way that they are orthogonalized.

The semiconductor film is crystallized by overlapping the first beam spot obtained by four of the first laser light with the second beam spot obtained by the second laser light. The first beam spot and the second beam spot are completely overlapped. In FIG. 4(B), the laser crystallization is performed in such a way that, for example, the substrate is moved using a uniaxial robot for X-axis and a uniaxial robot for Y-axis as shown in FIG. 4(A). It is appropriate that the scanning rate is in the range of several tens cm/s to several hundreds cm/s and it is set to 50 cm/s here.

Next, another example of the optical system included in the laser irradiation apparatus of the present invention is explained.

Figure 5:
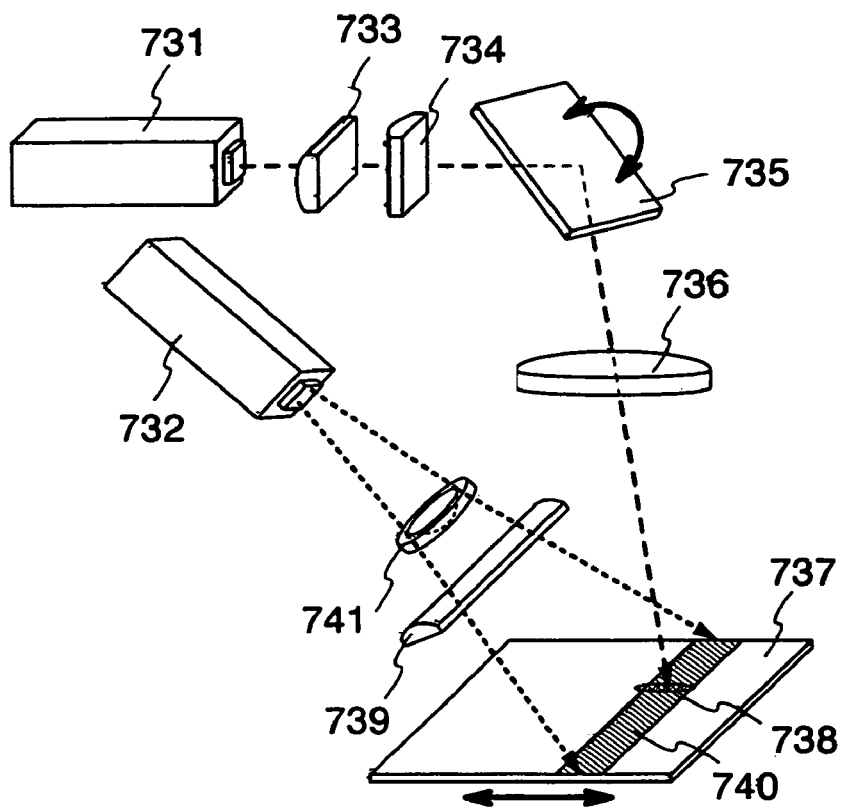
FIG. 5 shows the structure of the optical system in the laser irradiation apparatus of the present invention.

In FIG. 5, a reference numeral 731 denotes a laser oscillator oscillating the first laser light. The CW Nd:YVO$_4$ laser having a wavelength of the second harmonic (532 nm) with an output of 10 W is used as the laser oscillator 731. It is noted that although the second harmonic is used in FIG. 5, the present invention is not limited to this, and the other higher harmonics may be also employed.

A reference numeral 732 denotes a laser oscillator oscillating the second laser light. The CW Nd:YAG laser having a wavelength of the fundamental wave (1.064 μm) with an output of 2000 W is used as the laser oscillator. The first and the second laser light obtained from the laser oscillators 731 and 732 are preferably TEM$_{00}$ mode (single mode).

The first laser light oscillated from the laser oscillator 731 is converged to be elliptical through the beam expander including two cylindrical lenses 733 and 734. The converged laser light is reflected by a galvanometer mirror 735, and then it is converged again through an fθ lens (F-θ lens) 736. After that it is irradiated to a semiconductor film 737 formed over the substrate. A reference numeral 738 denotes the first beam spot formed on the semiconductor film 737 by the irradiation of the first laser light. The first beam spot 738 is the elliptical having a size of 20 μm in its minor axis and 400 μm in its major axis, for example.

The first beam spot 738 can be scanned by changing the angle of the galvanometer mirror 735. The fθ lens 736 can prevent the beam spot from changing in shape due to the change of the angle of the galvanometer mirror as much as possible. The incident angle of the first laser light to the semiconductor film 737 is set to 20°. The laser light can be irradiated to the whole surface of the semiconductor film 737 when the galvanometer mirror 735 is combined with the uniaxial stage in this embodiment mode. The first laser light is scanned preferably at a speed ranging from 100 to 2000 mm/s, preferably about 500 mm/s.

On the other hand, after the second laser light oscillated from the laser oscillator 732 is expanded uniformly through a concave lens 741, the second laser light is converged in one direction through a planoconvex cylindrical lens 739 and then it is irradiated to the semiconductor film 737 formed over the substrate. A reference numeral 740 denotes the second beam spot formed on the semiconductor film 737 by the irradiation of the second laser light. In this embodiment mode, the second beam spot 740 is scanned to one direction by covering the whole region scanned by the first beam spot 738 with the second beam spot 740 so that it can be easily synchronized with the first beam spot 738. It is also possible to use a beam homogenizer in order to form the second beam spot 740 being able to cover the whole region scanned by the first beam spot 738.

It is desirable that an incidence angle θ of the laser light satisfies the inequality of θ≧arctan (W/2d). In the inequality, it is defined that an incidence plane is perpendicular to the surface to be irradiated and is including a longer side or a shorter side of the beam spot assuming that the beam spot is rectangular in shape. Moreover, in the inequality, "W" is the length of the longer side or the shorter side included in the incidence plane and "d" is the thickness of the substrate having transparency to the laser light, which is placed at the surface to be irradiated. It is defined that a track of the laser light projected to the incidence plane has an incidence angle θ when the track is not on the incidence plane. When the laser light is made incident at an incidence angle θ, it is possible to perform uniform irradiation of the laser light without interference of reflected light from a surface of the substrate with reflected light from a rear surface of the substrate. The theory above is considered assuming that a refractive index of the substrate is 1. In fact, the substrate has a refractive index of approximately 1.5, and a larger value than the angle calculated in accordance with the above theory is obtained when the value around 1.5 is taken into account. However, since the beam spot has energy attenuated at opposite sides in the longitudinal direction thereof, the interference has a small influence on opposite sides and the value calculated in accordance with the inequality is enough to obtain the effect of attenuating the interference. The inequality with respect to θ is applicable only to the substrate transparent to the laser light.

It is noted that the optical system included in the laser irradiation apparatus of the present invention is not limited to that shown in this embodiment mode.

Embodiment Mode 5

This embodiment mode explains specifically the method for crystallizing the semiconductor film with the laser irradiation apparatus of the present invention.

Figure 6:
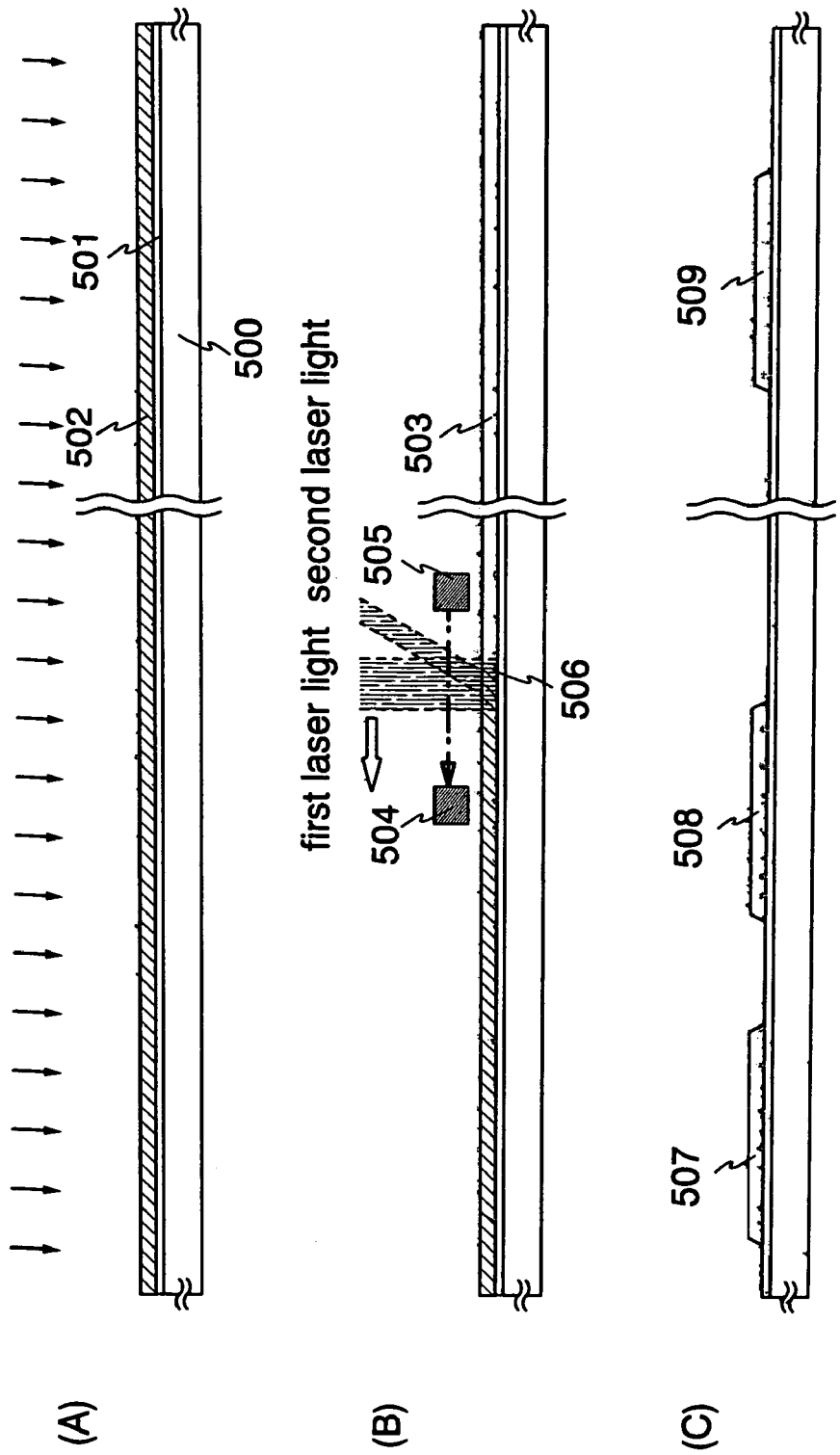
FIG. 6 shows the method for manufacturing a semiconductor device.

Initially, as shown in FIG. 6(A), a base film 501 is formed over a substrate 500. As the substrate 500, a glass substrate such as a barium borosilicate glass and an alumino-borosilicate glass, a quartz substrate, an SUS substrate, or the like can be used. Moreover, although a substrate made from flexible synthetic resin such as plastic usually tends to be inferior in heat resistance to the substrate 500 described above, it can be used as long as it resists the heat generated in the manufacturing process.

The base film 501 is provided so that alkaline metal such as Na or alkaline-earth metal included in the substrate 500 may not diffuse into the semiconductor film to have an adverse affect on a characteristic of a semiconductor element. Therefore, the base film 501 is formed of an insulating film such as silicon oxide, silicon nitride, or silicon nitride oxide, which can suppress the diffusion of the alkaline metal or the alkaline-earth metal into the semiconductor film. In this embodiment mode, a silicon nitride oxide film is formed in thickness from 10 nm to 400 nm (preferably from 50 nm to 300 nm) by the plasma-CVD method.

It is noted that the base film 501 may be formed in single layer or in laminated layer of a plurality of insulating films. In the case to use the substrate including the alkaline metal or the alkaline-earth metal in any way such as the glass substrate, the SUS substrate, or the plastic substrate, it is effective to provide the base film in order to prevent the diffusion of the impurities. On the other hand, when the diffusion of impurities does not lead to any significant problems, the base film does not always have to be provided.

Next, a semiconductor film 502 is formed over the base film. The thickness of the semiconductor film 502 is set in the range of 25 nm to 100 nm (preferably in the range of 30 nm to 60 nm). It is noted that the semiconductor film 502 may be amorphous semiconductor or poly-crystalline semiconductor. Moreover, not only silicon but also silicon germanium can be used as the semiconductor. When silicon germanium is used, it is preferable that the concentration of germanium ranges from 0.01 atomic % to 4.5 atomic %.

Next, the zeroth group element is added to the semiconductor film 502 by an ion dope method (ion doping method). This embodiment mode explains an example in which Ar is used as the zeroth group element (currently referred to as the 18th element). For example, in the case of Ar, Ar is added so that the concentration in the semiconductor film ranges from $1\times10^{18}$ atoms/cm3 to $1\times10^{21}$ atoms/cm3, preferably from $5\times10^{18}$ atoms/cm3 to $5\times10^{20}$ atoms/cm3. And the accelerating voltage affects the concentration distribution of Ar in the direction of the thickness of the semiconductor film 502. Therefore, the acceleration voltage is determined appropriately by the condition in which the concentration is made higher toward the surface side of the film, the concentration is made higher toward the substrate side of the film, or the concentration is made uniform all over the film. In this embodiment mode, the accelerating voltage was set to 30 kV.

It is noted that the laser light may be irradiated in the atmosphere of the gas with hydrogen added to the zeroth group element. In this case, the partial pressure of hydrogen is set in the range of 1% to 3%.

Next, as shown in FIG. 6(B), the semiconductor film 502 is crystallized with the laser irradiation apparatus of the present invention. In this embodiment mode, the Nd: YVO4 laser outputting the second harmonic (532 nm) having an energy of 5.5 W was used as the first laser light. As the second laser light, the Nd: YAG laser outputting the fundamental wave (1.064 μm) having an energy of 15 W was used.

And in the present invention, the magnetic field is applied with magnetic poles 504 and 505 to the region irradiated with the laser light. In this embodiment mode, the scanning direction of the laser light and the direction of the magnetic line of force in the magnetic field are corresponded. In FIG. 6(B), the relative moving direction of the laser light to the substrate 500 is shown with a white arrow while the direction of the magnetic line of force is shown with an arrow of a dotted line.

It is noted that the magnetic line of force is distributed as connecting the magnetic poles 504 and 505. The magnetic line of force is almost straight in the space where the distance from the magnetic poles 504 and 505 is shorter, but is curved to have a larger curvature as the distance is longer. Therefore, the moving direction of the beam spot is not always parallel to the direction of the magnetic line of force. In the present invention, it does not lead to any problems as long as the magnetic component in which the direction of passing magnetic line of force is almost constant is applied in the part 506 of the semiconductor film 502 irradiated with the beam spot.

The magnetic flux density in the part 506 irradiated with the beam spot is in the range of 1000 G to 10000 G, preferably in the range of 1500 G to 4000 G.

The laser light is irradiated in the atmosphere including the gas of the zeroth group element for 99.99% or more, preferably 99.9999% or more, in the load lock system chamber. In this embodiment mode, Ar is used as the zeroth group element.

It is noted that the zeroth group element that is doped and the zeroth group element that is used when the laser light is irradiated does not always have to be the same.

The semiconductor film 503 having further enhanced crystallinity is formed by irradiating the laser light to the semiconductor film 502 as described above.

Next, as shown in FIG. 6(C), the semiconductor film 503 is patterned to form island-shaped semiconductor films 507 to 509 and various kinds of semiconductor elements, typically TFT, are formed with these island-shaped semiconductor films 507 to 509.

When TFT is manufactured, for example, a gate insulating film is formed so as to cover the island-shaped semiconductor films 507 to 509. As the gate insulating film, silicon oxide, silicon nitride, silicon nitride oxide, or the like can be used. The plasma-CVD method, the sputtering method, or the like can be employed as the film-forming method.

Next, a gate electrode is formed by forming and patterning a conductive film on the gate insulating film. And the gate electrode or resist being formed and patterned is used as a mask, and the impurities imparting n-type or p-type conductivity is added to the island-shaped semiconductor films 507 to 509 to form a source region, a drain region, an LDD region, and the like.

TFT can be formed through such a series of processes. It is noted that the method for manufacturing the semiconductor device in the present invention is not limited to the process for manufacturing TFT described above following after forming the island-shaped semiconductor films. The variations of the on-current, the threshold, and the mobility between the elements can be suppressed when the semiconductor film crystallized with the laser irradiation method of the present invention is employed as an active layer of TFT.

Embodiment Mode 6

Unlike the embodiment mode 5, this embodiment mode explains an example in which the crystallization method by the laser irradiation apparatus of the present invention is combined with a crystallization method by the catalyst element.

Initially, the processes from forming the semiconductor film 502 up to doping the semiconductor film 502 with the zeroth group element are performed in reference up to FIG. 6(A) in the embodiment mode 5. Next, the surface of the semiconductor film 502 is coated with nickel acetate solution including Ni in the range of 1 ppm to 100 ppm in weight by a spin coating method. It is noted that the catalyst may be added not only by the spin coating method but also by the sputtering method, the vapor deposition method, the plasma process, or the like.

Next, a heating process was performed for 4 hours to 24 hours at a temperature ranging from 500° to 650°, for example for 14 hours at a temperature of 570°. This heating process forms the semiconductor film 520 in which the crystallization is promoted in the vertical direction toward the substrate 500 from the surface coated with nickel acetate solution. (FIG. 7(A))

It is noted that although nickel (Ni) is used as the catalyst element in this embodiment mode, the other element such as germanium (Ge), Iron (Fe), Palladium (Pd), Tin (Sn), Lead (Pb), Cobalt (Co), Platinum (Pt), Copper (Cu), or Gold (Au) may be also used.

Figure 7:
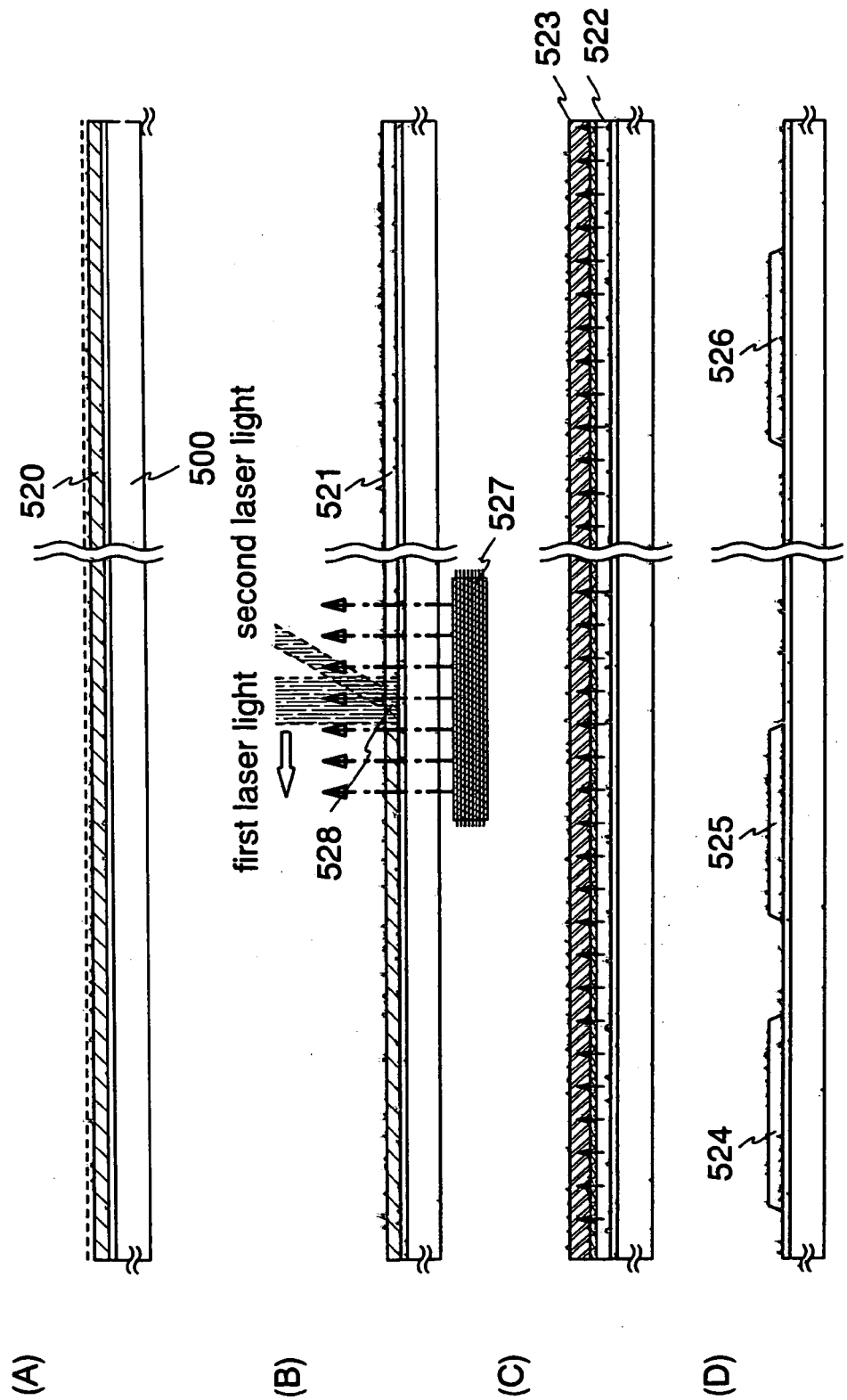
FIG. 7 shows the method for manufacturing a semiconductor device.

Next, as shown in FIG. 7(B), the semiconductor film 520 is crystallized using the laser irradiation apparatus of the present invention. In this embodiment mode, the Nd: YVO$_4$ laser outputting the second harmonic (532 nm) having an energy of 10 W was used as the first laser light. As the second laser light, the Nd: YAG laser outputting the fundamental wave (1.064 μm) having an energy of 500 W was used.

And in the present invention, the magnetic field is applied to the region irradiated with the laser light with a magnetic pole 527 from the side of the substrate 500 opposite to the side of the substrate 500 with the semiconductor film 520 formed thereover. In this embodiment mode, both the scanning direction of the laser light and the surface formed with the semiconductor film 520 are made perpendicular to the direction of the magnetic line of force in the magnetic field. In FIG. 7(B), the relative moving direction of the laser light to the substrate 500 is drawn with a white arrow, while the direction of the magnetic line of force is drawn with an arrow of a dotted line.

It is noted that the surface formed with the semiconductor film 520 is not necessarily perpendicular to the direction of the magnetic line of force. In the present invention, it does not lead to any problems as long as the magnetic component where the direction of passing magnetic line of force is almost constant is applied in the part 528 of the semiconductor film 520 irradiated with a beam spot.

And the magnetic flux density in the part 528 irradiated with the beam spot is set in the range of 1000 G to 10000 G, preferably in the range of 1500 G to 4000 G.

The laser light is irradiated in the atmosphere including the zeroth group element gas for 99.99% or more, preferably 99.9999% or more, in the load lock system chamber. In this embodiment mode, Ar is used as the zeroth group element.

It is noted that the zeroth group element that is doped and the zeroth group element that is used when the laser light is irradiated does not always have to be the same.

The semiconductor film 521 whose crystallinity is further enhanced is formed by irradiating the laser light to the semiconductor film 520 as described above.

It is considered that the catalyst element (Ni here) is included at a concentration of approximately $1 \times 10^{19}$ atoms/cm$^3$ in the semiconductor film 521 that is crystallized with the catalyst element as shown in FIG. 7(B). Next, the catalyst element existing in the semiconductor film 521 is gettered.

First, an oxide film 522 is formed over the surface of the semiconductor film 521 as shown in FIG. 7(C). By forming the oxide film 522 having a thickness from 1 nm to 10 nm, the surface of the semiconductor film 521 can be prevented from becoming rough due to the etching in the following etching process.

The oxide film 522 can be formed by a known method. For example, the oxide film 522 may be formed by oxidizing the surface of the semiconductor film 521 using ozone water or using the solution in which hydrogen peroxide solution is mixed with sulfuric acid, hydrochloric acid, nitric acid, or the like. Alternatively, the oxide film 522 may be formed by the plasma process, heating process, or ultraviolet ray irradiation in the atmosphere including oxygen. Moreover, the oxide film may be formed separately by the plasma-CVD method, the sputtering method, the vapor deposition method, or the like.

A semiconductor film 523 for the gettering including the noble gas element not less than $1 \times 10^{20}$ atoms/cm³ is formed in thickness from 25 nm to 250 nm over the oxide film 522 by the sputtering method. It is desirable that the mass density of the semiconductor film 523 for the gettering is lower than that of the semiconductor film 521 in order to increase the selecting ratio of the etching to the semiconductor film 521.

As the noble gas element, one kind or plural kinds selected from the group consisting of Helium (He), Neon (Ne), Argon (Ar), Krypton (Kr), and Xenon (Xe) are used.

Next the gettering is performed through the heating process by the furnace annealing method or the RTA method. When the furnace annealing method is employed, the heating process is performed for 0.5 hours to 12 hours at a temperature ranging from 450° to 600° in the atmosphere of nitrogen. When the RTA method is employed, a lamp light source for heating is turned on for 1 to 60 seconds, preferably 30 seconds to 60 seconds, which is repeated from 1 time to 10 times, preferably from 2 times to 6 times. The lamp light source may have any luminescence intensity, but the luminescence intensity is set so that the semiconductor film is heated instantaneously at a temperature ranging from 600° to 1000°, preferably from 700° to 750°.

Through the heating process, the catalyst element inside the semiconductor film 521 moves to the semiconductor film 523 for the gettering due to the diffusion as indicated by an arrow and the catalyst element is thus gettered.

Next, the semiconductor film 523 for the gettering is removed by etching selectively. The etching process is performed by dry etching with $CIF_3$ not applying plasma, or by wet etching with alkali solution such as the solution including hydrazine or tetraethylammonium hydroxide ($(CH_3)_4NOH$). On this occasion, the oxide film 522 prevents the oxide film 521 from being etched.

Next, the oxide film 522 is removed by hydrofluoric acid.

Next, the semiconductor film 521 after removing the oxide film 522 is patterned to form the island-shaped semiconductor films 524 to 526 (FIG. 7(D)).

It is noted that the gettering process in the present invention is not limited to the method described in this embodiment mode. The catalyst element in the semiconductor film may be reduced with the other method.

Next, various semiconductor elements, typified by TFT, are formed using these island-shaped semiconductor films 524 to 526.

It is noted that the crystallinity of the semiconductor film can be more enhanced compared with the case in the embodiment mode 5 when the semiconductor film is crystallized with the irradiation of the laser light after it is crystallized with the catalyst element as described in this embodiment mode. In the embodiment mode 5, the crystallization is promoted in such a way that crystal nuclei arise randomly after being irradiated with the laser light. On the other hand, in this embodiment mode, the crystal formed in the crystallization by the catalyst element stays as it is without being melted by the irradiation of the laser light in the side closer to the substrate and the crystallization is promoted by having the crystal as its crystal nuclei. As a result, the crystallization by the irradiation of the laser light is easy to be promoted from the substrate side to the surface uniformly, and thus the surface is prevented from becoming rough compared with the case of the embodiment mode 5. Therefore, the variation of the characteristic of the semiconductor element, typically TFT, can be more suppressed.

It is noted that this embodiment mode explained the process to promote crystallization by performing the heating process after the catalyst element is added, and then to enhance crystallinity further by irradiating the laser light. However, the present invention is not limited to this, and the heating process may be omitted. Specifically, after adding the catalyst element, the laser light may be irradiated instead of the heating process in order to enhance the crystallinity.

Embodiment Mode 7

This embodiment mode, unlike the embodiment mode 6, explains an example in which the crystallizing method using the laser irradiation apparatus of the present invention is combined with the crystallizing method using the catalyst element.

Initially, the processes from forming the semiconductor film 502 to doping the zeroth group element to the semiconductor film 502 are performed in reference up to FIG. 6(A) in the embodiment mode 5. Next, a mask 540 having an opening was formed over the semiconductor film 502. And the nickel acetate solution including Ni in the range of 1 ppm to 100 ppm in weight was applied to the surface of the semiconductor film 502 by the spin coating method. It is noted that the method for adding the catalyst element is not limited to this, and the sputtering method, the vapor deposition method, the plasma process, or the like may be also employed. Applied nickel acetate solution contacts the semiconductor film 502 in the opening of the mask 540. (FIG. 8(A))

Next, the heating process was performed for 4 hours to 24 hours at a temperature ranging from 500° to 650°, for example for 14 hours at a temperature of 570°. This heating process forms a semiconductor film 530 in which the crystallization is promoted from the surface coated with the nickel acetate solution as indicated by an arrow of a continuous line. (FIG. 8(A))

It is noted that the catalyst element cited in the embodiment mode 6 can be used as the catalyst element.

Figure 8:
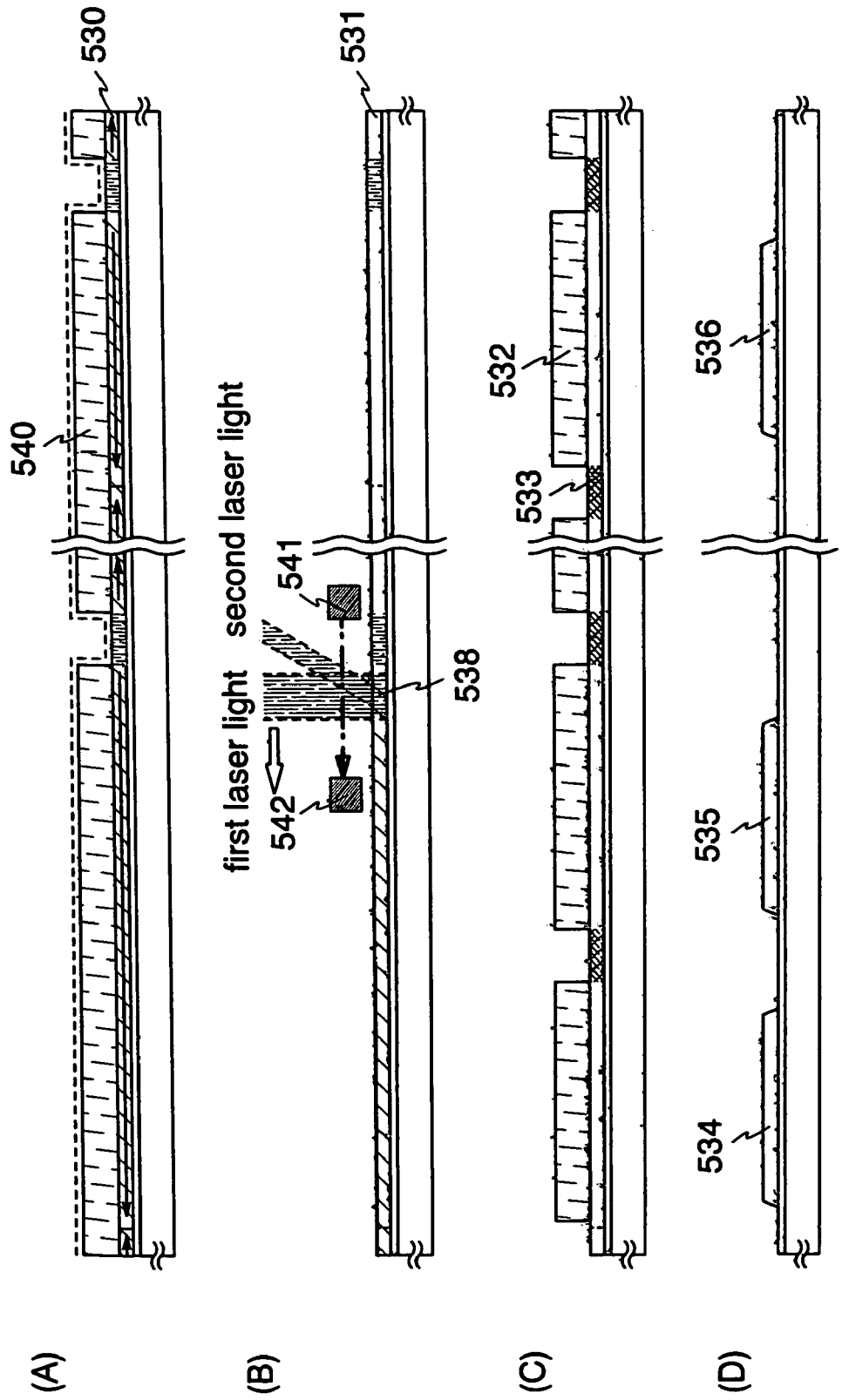
FIG. 8 shows the method for manufacturing a semiconductor device.

Next, after the mask 540 is removed, the semiconductor film 530 is crystallized using the laser irradiation apparatus of the present invention as shown in FIG. 8(B). In this embodiment mode, the Nd: $YVO_4$ laser outputting the second harmonic (532 nm) having an energy of 10 W was used as the first laser light. As the second laser light, the Nd: YAG laser outputting the fundamental wave (1.064 μm) having an energy of 2000 W was used.

And in the present invention, the magnetic field is applied with the use of magnetic poles 541 and 542 to the region irradiated by the laser light. In this embodiment mode, the scanning direction of the laser light and the direction of the magnetic line of force are corresponded. In FIG. 8(B), the relative moving direction of the laser light to the substrate 500 is shown with a white arrow while the direction of the magnetic line of force is shown with an arrow of a dotted line.

It is noted that the magnetic line of force is distributed as connecting the magnetic poles 541 and 542. The magnetic line of force is almost straight in the space where the distance from the magnetic poles 541 and 542 is shorter, but is curved to have a larger curvature as the distance is longer. Therefore, the moving direction of the beam spot is not always parallel to the direction of the magnetic line of force. In the present invention, it does not lead to any problems as long as the magnetic component in which the direction of passing magnetic line of force is almost constant is applied in the part 538 of the semiconductor film 530 irradiated with the beam spot.

The magnetic flux density in the region 538 irradiated with the beam spot is set in the range of 1000 G to 10000 G, preferably in the range of 1500 G to 4000 G.

The laser light is irradiated in the atmosphere including the zeroth group element gas for 99.99% or more, preferably 99.9999% or more, in the load lock system chamber. In this embodiment mode, Ar is used as the zeroth group element gas.

It is noted that the zeroth group element that is doped and the zeroth group element that is used when the laser light is irradiated does not always have to be the same.

A semiconductor film 531 having further enhanced crystallinity is formed by irradiating the laser light to the semiconductor film 530 as described above.

It is noted that as shown in FIG. 8(B), the semiconductor film 531 crystallized with the catalyst element is assumed to include the catalyst element (Ni here) at a concentration of approximately $1 \times 10^{19}$ atoms/cm$^3$. Sequentially the catalyst element existing in the semiconductor film 531 is gettered.

As shown in FIG. 8(D), a silicon oxide film 532 for a mask is formed 150 nm in thickness so as to cover the semiconductor film 530. And then an opening is provided by patterning the semiconductor film 530 to expose a part of the semiconductor film 530. Then, phosphorous is added to provide a region 533 in which phosphorous is added in the semiconductor film 530.

When the heating process is performed in this state for 5 hours to 24 hours at a temperature ranging from 550° to 800° in the atmosphere of nitrogen, for example for 12 hours at a temperature of 600°, the region 533 added with phosphorous in the semiconductor film 530 works as a gettering site. As a result, the catalyst element left in the semiconductor film 530 is segregated in the gettering region 533 with phosphorous added therein. (FIG. 8(B))

And the concentration of the catalyst element in the rest of the regions in the semiconductor film 530 can be decreased to 1×1017 atms[sic]/cm3 or less by removing the region 533 added with phosphorous by means of etching.

After removing the silicon oxide film 532 for the mask, the semiconductor film 531 is patterned to form island-shaped semiconductor films 534 to 536. (FIG. 8(D))

It is noted that the gettering process in the present invention is not limited to the method shown in this embodiment mode. The other method may be employed in order to decrease the catalyst element in the semiconductor film.

Next, as shown in FIG. 8(D), the semiconductor film 531 is patterned to form the island-shaped semiconductor films 534 to 536, which are utilized to form the various kinds of semiconductor elements typified by TFT.

It is noted that the crystallinity of the semiconductor film can be more enhanced compared with the case of the embodiment mode 5 when the semiconductor film is crystallized with the irradiation of the laser light after it is crystallized with the catalyst element as described in this embodiment mode. In the embodiment mode 5, the crystallization is promoted in such a way that crystal nuclei arise randomly after being irradiated with the laser light. On the other hand, in this embodiment mode, the crystal formed in the crystallization by the catalyst element stays as it is without being melted by the irradiation of the laser light in the side closer to the substrate and the crystallization is promoted by having the crystal as its crystal nuclei. As a result, the crystallization by the irradiation of the laser light is easy to be promoted from the substrate side to the surface uniformly, and thus the surface is prevented from becoming rough compared with the case in the embodiment mode 5. Therefore, the variation of the characteristic of the semiconductor element, typically TFT, can be more suppressed.

It is noted that this embodiment mode explained the composition to promote the crystallization by performing the heating process after the catalyst element is added, and then to enhance crystallinity further by the irradiation of the laser light. However, the present invention is not limited to this and the heating process may be omitted. Specifically, after adding the catalyst element, the laser light may be irradiated instead of the heating process in order to enhance the crystallinity.

Embodiment Mode 8

This embodiment mode explains the structure of the laser irradiation apparatus including the load lock system chamber.

Figure 9:
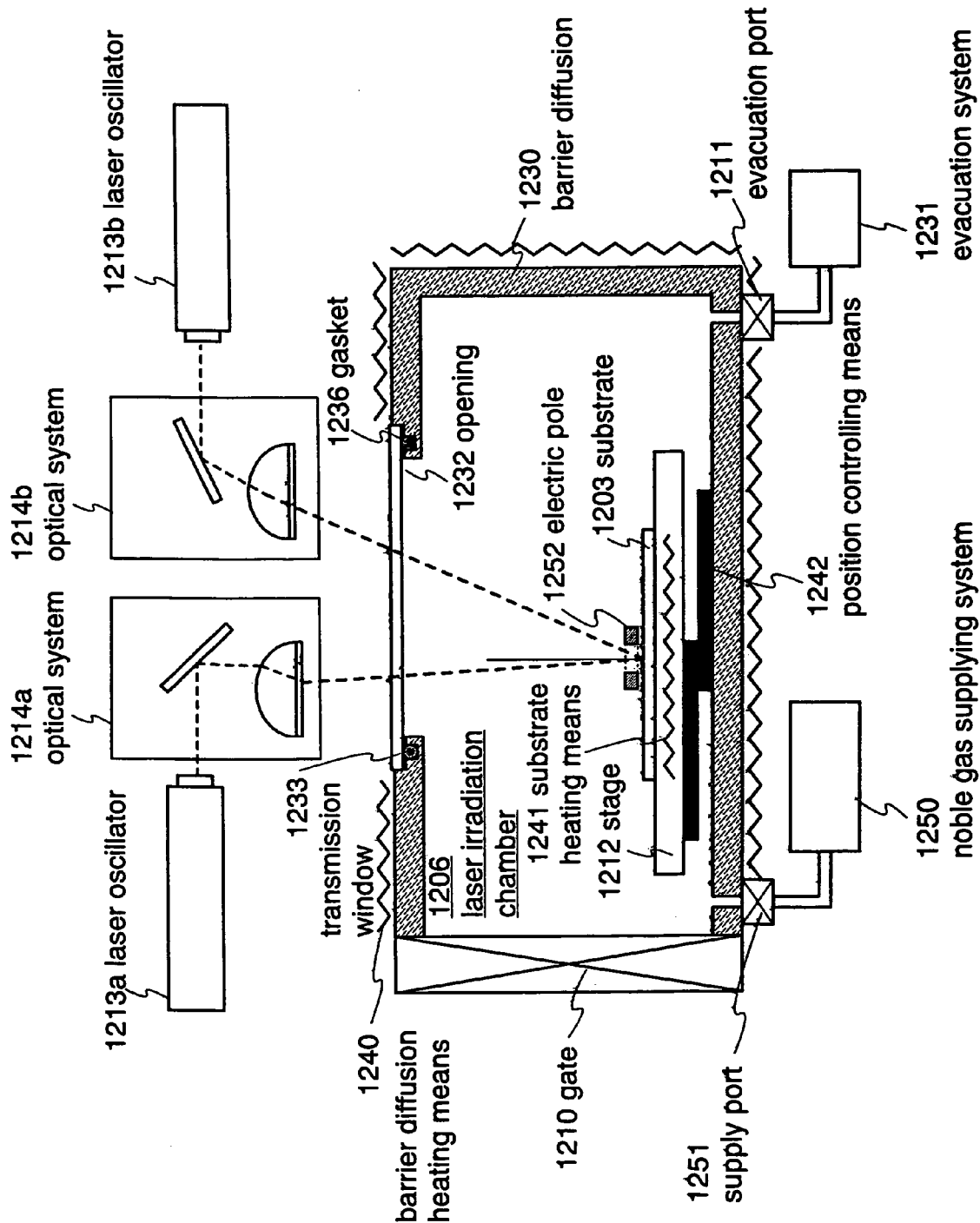
FIG. 9 shows the structure of the laser irradiation apparatus having a load lock system chamber.

FIG. 9 shows the structure of the laser irradiation apparatus in this embodiment mode. A laser irradiation chamber 1206 is surrounded by a barrier diffusion 1230. It is noted that since the laser light is highly directional and has the high energy density, the barrier diffusion 1230 preferably has the characteristic of absorbing the reflected light in order to prevent the reflected light from irradiating to an inappropriate region. In addition, cooling water may be circulated in the barrier diffusion in order to prevent the rise of the temperature due to the absorption of the reflected light.

Moreover, as shown in FIG. 9, means 1240 for heating the barrier diffusion (barrier diffusion heating means) may be provided to heat the barrier diffusion when the laser irradiation chamber is evacuated.

And a gate 1210 corresponds to a transferring gate for transferring the substrate to the laser irradiation chamber 1206. The gas inside the laser irradiation chamber 1206 can be evacuated by an evacuation system 1231 connected to an evacuation port 1211. The noble gas can be supplied into the laser irradiation chamber 1206 by a noble gas supplying system 1250 connected to a supply port 1251.

A reference numeral 1212 denotes a stage on which the substrate 1203 is mounted. When the stage is moved according to position controlling means 1242, the position of the substrate can be controlled and the irradiation position of the laser light can be moved. As shown in FIG. 9, means 1241 for heating the substrate (substrate heating means) may be provided in the stage 1212.

An opening 1232 provided in the barrier diffusion 1230 is covered by a window 1233 to transmit the laser light (transmission window). It is preferable that the transmission window is made of the material that is hard to absorb the laser light. For example the quarts or the like is appropriate. A gasket 1236 is provided between the transmission window 1233 and the barrier diffusion 1230. The gasket 1236 can prevent the atmosphere from entering the laser irradiation chamber from the interspace between the transmission window 1233 and the barrier diffusion 1230.

Initially, the substrate 1203 with the semiconductor film formed thereon is transferred. After the gate 1210 is closed, the laser irradiation chamber 1206 is kept with the atmosphere of the noble gas by using the evacuation system 1231 and the noble gas supplying system 1250.

The beam spot of the first laser light oscillated from a laser oscillator 1213a is shaped through an optical system 1214a and the substrate 1203 is irradiated with the shaped beam spot. In addition, the beam spot of the second laser light oscillated from a laser oscillator 1213b is shaped through an optical system 1214b and the substrate 1203 is irradiated with the shaped beam spot. The incidence angle θ is preferably set to more than 0°, more preferably between 5° and 30°, in order to prevent the return light and to perform the uniform irradiation.

A reference numeral 1252 denotes the magnetic pole of the magnetic circuit, which applies the magnetic field to the semiconductor film formed over the substrate 1203. It is noted that although the magnetic field is applied from the side of the substrate 1203 irradiated with the laser light, the present invention is not limited to this. The magnetic field may be applied from the side of the substrate 1203 opposite to the side thereof irradiated with the laser light by incorporating the magnetic pole 1252 into the stage 1212.

It is noted that the laser irradiation chamber 1206 shown in FIG. 9 may be one chamber included in the multi-chambers. When the chamber for doping the noble gas element to the semiconductor film is provided so that a series of the processes from doping the noble gas element up to crystallizing with the laser light are performed in the multi-chamber without exposing it to the air, it is possible to prevent the impurities from mixing into the semiconductor film more effectively.

It is noted that when the laser irradiation apparatus is employed for crystallizing the semiconductor film, it is possible to make the crystallinity of the semiconductor film more uniform. The method for manufacturing the semiconductor device in the present invention can be applied to manufacture the integrated circuit and the semiconductor display device. Particularly, when the present invention is applied to the semiconductor element such as the transistor provided in the pixel portion of the semiconductor display device such as the liquid crystal display device, the light-emitting device having the light-emitting element typified by the organic light-emitting element equipped in each pixel, DMD (Digital Micromirror Device), PDP (Plasma Display Panel), or FED (Field Emission Display), it is possible to prevent the horizontal stripes from being visible due to the energy distribution of the laser light irradiated to the pixel portion thereof.

EMBODIMENTS

Hereinafter the embodiment of the present invention is explained.

Embodiment 1

A structure of the pixel in the light-emitting device, one of the semiconductor devices formed using the laser irradiation apparatus of the present invention, is explained with reference to FIG. 10.

Figure 10:
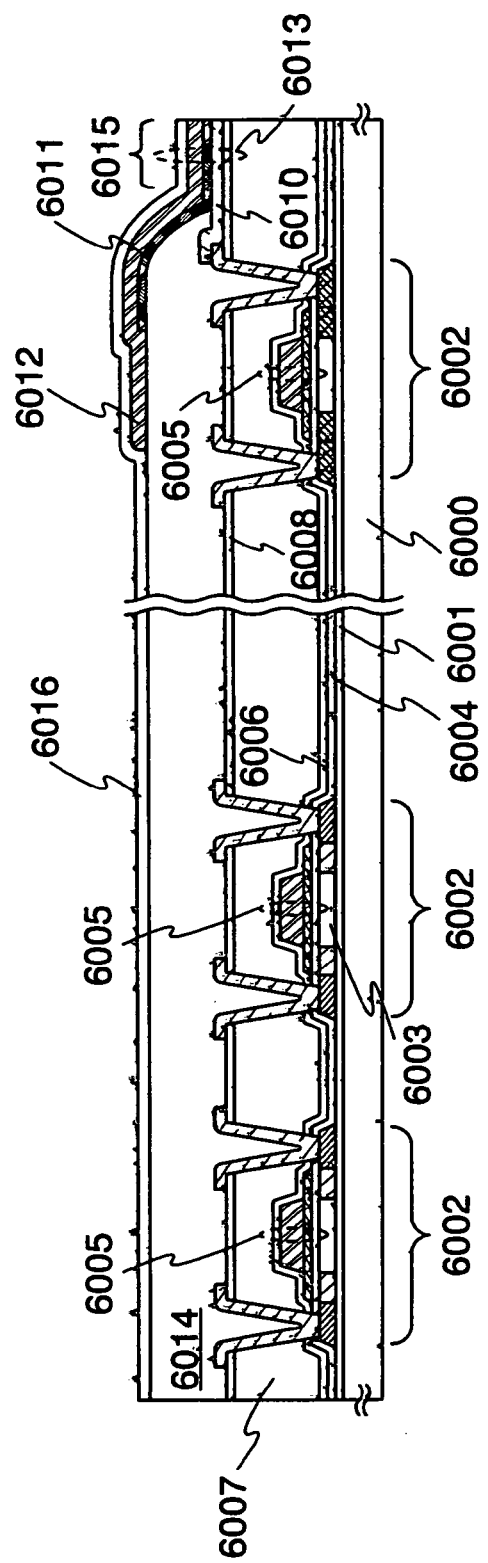
FIG. 10 is a cross-sectional view of the light-emitting device manufactured with the laser irradiation apparatus of the present invention.

In FIG. 10, a base film 6001 is formed over a substrate 6000 and a transistor 6002 is formed over the base film 6001. The transistor 6002 has an active layer 6003, a gate electrode 6005, and a gate insulating film 6004 sandwiched between the active layer 6003 and the gate electrode 6005.

A polycrystalline semiconductor film crystallized using the laser irradiation apparatus of the present invention is used as the active layer 6003. It is noted that not only silicon but also silicon germanium may be employed as the active layer. When the silicon germanium is employed, it is preferable that the concentration of germanium is in the range of 0.01 atomic % to 4.5 atomic %. Alternatively silicon with carbon nitride added may be also employed.

Silicon oxide, silicon nitride, or silicon oxynitride can be employed as the gate insulating film 6004. Alternatively, a film in which these are laminated, for example a film in which SiN is laminated on $SiO_2$ may be employed as the gate insulating film. The $SiO_2$ film was formed with the plasma-CVD method mixing TEOS (Tetraethyl Orthosilicate) and $O_2$, at a reaction pressure of 40 Pa, with a substrate temperature ranging from 300° to 400°, by discharging at a high frequency (13.56 MHz) with an electric density ranging from 0.5 $W/cm^2$ to 0.8 $W/cm^2$. Thus manufactured silicon oxide film obtains good characteristic as the gate insulating film by performing the thermal annealing at a temperature ranging from 400° to 500° thereafter. Aluminum nitride can be used as the gate insulating film. The aluminum nitride is comparatively high in heat conductivity, and thereby the heat generated in TFT can be diffused effectively. Moreover, a film in which the aluminum nitride is laminated on the silicon oxide, silicon oxynitride, or the like not including aluminum may be used as the gate insulating film. Furthermore, $SiO_2$ formed with RF sputtering method using Si as a target may be employed as the gate insulating film.

The gate electrode 6005 is formed of the element selected from the group consisting of Ta, W, Ti, Mo, Al, and Cu, or is formed of a compound material or of an alloy material including the above element as its main component. Alternatively a semiconductor film, typically a polycrystalline silicon film doped with the impurities such as phosphorous, may be employed. In addition, the gate electrode 6005 may be formed of not only the conductive film of a single layer, but also the conductive films with a plurality of layers laminated.

For example, it is preferable that these conductive films have a structure in which the first conductive film is formed of a tantalum nitride (TaN) and the second conductive film is formed of W, a structure in which the first conductive film is formed of a tantalum nitride (TaN) and the second conductive film is formed of Ti, a structure in which the first conductive film is formed of tantalum nitride (TaN) and the second conductive film is formed of Al, or a structure in which the first conductive film is formed of tantalum nitride (TaN) and the second conductive film is formed of Cu. Moreover, the semiconductor film, typically the polycrystalline silicon film doped with the impurities such as phosphorous, or AgPdCu alloy may be employed as the first and the second conductive films.

The conductive film may be formed not only in two-layers structure, but also in three-layers structure in which for example a tungsten film, an alloy film of aluminum and silicon (Al—Si), and a titanium nitride film are laminated in order. When the conductive film is formed in three-layers structure, tungsten nitride may be employed instead of the tungsten, an alloy film of aluminum and titanium (Al—Ti) may be employed instead of the alloy film of aluminum and silicon (Al—Si), and a titanium film may be employed instead of the titanium nitride film. It is important to select the optimum etching method and the optimum kind of etchant appropriately according to the material of the conductive film.

The transistor 6004 is covered with a first interlayer insulating film 6006 on which a second interlayer insulating film 6007 and a third interlayer insulating film 6008 are laminated. The first interlayer insulating film 6006 can be formed of a silicon oxide film, a silicon nitride film, or a silicon oxynitride film in single layer or in laminated layer with the plasma-CVD method or the sputtering method. The first interlayer insulating film 6006 may be also formed of a film in which the silicon oxynitride film including more oxygen than nitrogen in mole fraction is formed on the silicon nitride oxide film including more nitrogen than oxygen in mole fraction. When the heating process (heating process at a temperature ranging from 300° to 550° for 1 hour to 12 hours) is performed after forming the first interlayer insulating film 6006, it is possible to terminate (hydrogenation) the dangling bond of the semiconductor included in the active layer 6003 by hydrogen included in the first interlayer insulating film 6006.

The second interlayer insulating film 6007 may be formed of an organic resin film, an inorganic insulating film, an insulating film including Si—$CH_x$ bond and Si—O bond made as the starting material from the siloxane-based material or the like. In this embodiment, non-photosensitive acrylic is used. The third interlayer insulating film 6008 is formed of a film which is harder to transmit the material causing to promote deterioration of the light-emitting element such as moisture, oxygen, and the like compared with the other insulating films. It is preferable to use typically a DLC film, a carbon nitride film, a silicon nitride film formed with the RF sputtering method, or the like.

In FIG. 10, a reference numeral 6010 denotes an anode, a reference numeral 6011 denotes an electroluminescent layer, a reference numeral 6012 denotes a cathode, and the part in which the anode 6010, the electroluminescent layer 6011, and the cathode 6012 are overlapped corresponds to a light-emitting element 6013. One of the transistors 6002 is a driver transistor for controlling the current supplied to the light-emitting element 6013 and thereby it is connected directly or serially through the other circuit elements to the light-emitting element 6013.

The electroluminescent layer 6011 has a structure of a single light-emitting layer or has a structure with a plurality of layers including the light-emitting layer laminated.

The anode 6010 is formed on the third interlayer insulating film 6008. An organic resin film 6014 is formed as the barrier diffusion on the third interlayer insulating film 6008. The organic resin film 6014 has an opening 6015 and the light-emitting element 6013 is formed by overlapping the anode 6010, the electroluminescent layer 6011, and the cathode 6012 in the opening.

And a passivation film 6016 is formed on the organic resin film 6014 and the cathode 6012. As well as the third interlayer insulating film 6008, the passivation film 6016 is formed of the film which is harder to transmit the material causing to promote deterioration of the light-emitting element such as moisture and oxygen, for example a DLC film, a carbon nitride film, a silicon nitride film formed by the RF sputtering method, or the like. It is also possible to form the passivation film by laminating the film that is hard to transmit moisture, oxygen, and the like described above and a film which is easier to transmit moisture, oxygen, and the like compared with the above film.

In addition, the organic resin film 6014 is heated in the vacuum atmosphere in order to remove the moisture, oxygen, and the like stuck thereto before the electroluminescent layer 6011 is formed. Specifically, the heating process is performed in the vacuum atmosphere at a temperature ranging from 100° to 200° for 0.5 hours to 1 hour. It is desirable that the pressure is set to $3 \times 10^{-7}$ Torr or less, and it is the most desirable that the pressure is set to $3 \times 10^{-8}$ Torr or less if possible. When the electroluminescent layer is formed after the heating process is performed to the organic resin film in the vacuum atmosphere, it is possible to enhance reliability by keeping it in the vacuum atmosphere until just before forming the electroluminescent layer.

In addition, it is desirable that the end of the opening 6015 in the organic resin film 6014 is made into a round shape so that the end portion of the electroluminescent element layer 6011 formed so as to partially overlap on the organic resin film 6014 does not have a hole. To be more specific, it is desirable that the radius of curvature of the curve line drawn by the sectional surface of the organic resin film in the opening is in the range of 0.2 μm to 2 μm.

With the above structure, the coverage of the electroluminescent layer and the cathode that are formed later can be enhanced, and thereby it is possible to prevent the anode 6010 and the cathode 6012 from shorting out in the hole formed in the electroluminescent layer 6011. Moreover, by relaxing the stress of the electroluminescent layer 6011, the defect in which the light-emitting region decreases, what is called shrink, can be reduced to enhance the reliability.

In addition, FIG. 10 shows an example in which a positive photosensitive acrylic resin is used as the organic resin film 6014. The photosensitive organic resin is classified into the positive type in which the region exposed with the energy line such as beam, electron, ion, or the like is removed, and the negative type in which the exposed region is not removed. In the present invention, the organic resin film of the negative type may be also used. Moreover, the organic resin film 6014 may be formed of the photosensitive polyimide. When the organic resin film 6014 is formed of the acrylic of the negative type, the end section in the opening 6015 becomes an S character-like cross-sectional shape. On this occasion, it is desirable that the radius of the curvature in the upper end and the lower end of the opening is in the range of 0.2 μm to 2 μm.

The anode 6010 can be formed of the transparent conductive film. Not only ITO, but also the transparent conductive film in which indium oxide is mixed with tin oxide (ZnO) by 2% to 20% may be used. In FIG. 10, ITO is used as the anode 6010. The anode 6010 may be polished by CMP method or by cleaning (bellcleaning) with porous body of polyvinyl alcohols so that the surface of the anode 6010 is made flat. Furthermore, the surface of the anode 6010 may be irradiated with the ultraviolet ray or may be processed with oxygen plasma after polishing it with the CMP method.

The cathode 6012 can be formed of the other known material when it is the conductive film having low work function. For example, Ca, Al, CaF, MgAg, AlLi, or the like is desirable.

It is noted that FIG. 10 shows the structure in which the light emitted from the light-emitting element is irradiated to the side of the substrate 6000. However, the structure in which the light is irradiated to the side opposite to the substrate may be also employed.

In addition, although the transistor 6002 is connected to the anode 6010 of the light-emitting element in FIG. 10, the present invention is not limited to this structure, and the transistor 6002 may be connected to the cathode 6012 of the light-emitting element. In this case, the cathode is formed on the third interlayer insulating film 6008 using TiN or the like.

In fact, after the state shown in FIG. 10 is obtained, it is preferable to pack (enclose) with the passivation film (laminated film, ultraviolet cured resin film, or the like) or transparent cover member, which is highly airtight and hardly degassing in order not to be exposed to air. The reliability of OLED is enhanced when the inside of the cover member is filled with the inert atmosphere or the material having moisture-absorption characteristic (barium oxide, for example) is set in the cover member.

It is noted that the light-emitting device of the present invention is not limited to the manufacturing process described above. Moreover, the semiconductor device in the present invention is not limited to the light-emitting device.

Embodiment 2

This embodiment explains a shape of the first beam spot obtained by combining a plurality of the first laser light shown in FIG. 4(B). It is noted that the first beam spot is referred to as a beam spot simply in this embodiment.

FIG. 11(A) shows an example of the shape of the beam spot of the laser light oscillated from each of a plurality of laser oscillators on a processed object. The beam spot shown in FIG. 11(A) is elliptical in shape. It is noted that the shape of the beam spot of the laser light oscillated from the laser oscillator is not limited to elliptical in the present invention. The shape of the beam spot depends on the kind of the laser, and the shape thereof can be changed through an optical system. For example, the laser light emitted from the excimer laser L3308 manufactured by Lambda Physik, Inc. (wavelength 308 nm, pulse with 30 ns) is rectangular in shape having a size of 10 mm×30 nm (both are width at half maximum in a beam profile). On the other hand, the laser light emitted from a YAG laser having a cylindrical rod is circular in shape. The laser light emitted from a YAG laser having a slab rod is rectangular in shape. These laser light can be also changed into the laser light having a desired size by further shaping them through the optical system.

FIG. 11(B) shows energy density distribution of the laser light in Y direction of a major axis of the beam spot shown in FIG. 11(A). The beam spot shown in FIG. 11(A) corresponds to the region satisfying the energy density that is $1/e^2$ of the peak value of the energy density in FIG. 11(B). The energy density distribution of the laser light whose beam spot is elliptical becomes higher toward the center O of the ellipse.

Next, FIG. 11(C) shows the shape of the beam spots when the laser light having the beam spot shown in FIG. 11(A) is combined. It is noted that FIG. 11(C) shows the case in which four beam spots of the laser light are overlapped to form one linear beam spot but the number of the overlapped beam spots is not limited to this.

As shown in FIG. 11(C), the beam spots of the laser light are combined to form one beam spot in such a way that the major axis of each ellipse is corresponded and the beam spots are overlapped partially one another. It is noted that the straight line obtained by connecting the center O of each ellipse is defined as the center axis of the beam spot.

FIG. 11(D) shows the energy density distribution of the laser light in y direction of the center axis of the beam spots after being combined shown in FIG. 11(D). It is noted that the beam spot shown in FIG. 11(C) corresponds to the region satisfying the energy density that is $1/e^2$ of the peak value of the energy density in FIG. 11(B). The energy density is added in the portion in which each beam spot before being combined is overlapped. For example, when the energy density E1 and the energy density E2 of the overlapped beam as shown diagrammatically are added, the added value is almost equal to the peak value E3 of the energy density of the beam. Thus the energy density is made flat between the centers O of the respective ellipse.

It is ideal for the value added with E1 and E2 to be equal to E3. In fact, however, they are not always equal. It is possible for a designer to determine the margin of the gap between the value added with E1 and E2, and the value E3 appropriately.

As shown in FIG. 11(A), when the beam spot is employed singularly, it is difficult to irradiate the semiconductor film or the whole part to become the island that contacts the flat portion of the insulating film with the laser light having homogeneous energy density since the beam spot has Gaussian energy distribution. FIG. 11(D) indicates, however, that it is possible to enhance the crystallinity of the semiconductor film effectively because the region having homogeneous energy density is more enlarged by employing a plurality of laser light overlapped so as to compensate the part having low energy density each other than employing the laser light singularly not being overlapped with a plurality of laser light.

It is possible to perform the structure of this embodiment in combination with the embodiment 1.

What is claimed is:

1. A method for manufacturing a semiconductor device comprising:
   adding first noble gas to a semiconductor film formed over a substrate, and
   irradiating first laser light having a wavelength of a harmonic and second laser light having a wavelength of a fundamental wave to the semiconductor film added with the first noble gas in an atmosphere of second noble gas,
   wherein a magnetic field is applied from a magnetic pole under the substrate to the semiconductor film added with the first noble gas when the first laser light and the second laser light are irradiated.

2. A method for manufacturing a semiconductor device according to claim 1, wherein the first laser light and the second laser light are oscillated from continuous wave laser oscillators.

3. A method for manufacturing a semiconductor device according to claim 1, wherein the first laser light has a wavelength of a second harmonic.

4. A method for manufacturing a semiconductor device according to claim 1, wherein a beam spot of the first laser light is completely overlapped with a beam spot of the second laser light.

5. A method for manufacturing a semiconductor device according to claim 1, wherein the noble gas is selected from the group consisting of He, Ne, Ar, Kr, or Xe.

6. A method for manufacturing a semiconductor device according to claim 1, wherein a concentration of the noble gas is in the range of $1 \times 10^{18}$ atoms/cm$^3$ to $1 \times 10^{21}$ atoms/cm$^3$.

7. A method for manufacturing a semiconductor device according to claim 1, wherein a magnetic flux density of the magnetic field is in the range of 1000 G to 10000 G.

8. A method for manufacturing a semiconductor device according to claim 1, wherein the semiconductor film is added with the first noble gas by an ion doping method.

9. A method for manufacturing a semiconductor device comprising:
   adding first noble gas to a semiconductor film formed over a substrate, and
   irradiating first laser light having a wavelength of a harmonic and second laser light having a wavelength of a fundamental wave to the semiconductor film added with the first noble gas in an atmosphere of second noble gas,
   wherein a magnetic field generated between magnetic poles over the semiconductor film is applied to the semiconductor film added with the first noble gas when the first laser light and the second laser light are irradiated.

10. A method for manufacturing a semiconductor device according to claim 9, wherein a scanning direction of the substrate is parallel to a direction of major axes of the magnetic poles.

11. A method for manufacturing a semiconductor device according to claim 9, wherein a scanning direction of the substrate is perpendicular to a direction of major axes of the magnetic poles.

12. A method for manufacturing a semiconductor device according to claim 9, wherein the first laser light and the second laser light are oscillated from continuous wave laser oscillators.

13. A method for manufacturing a semiconductor device according to claim 9, wherein the first laser light has a wavelength of a second harmonic.

14. A method for manufacturing a semiconductor device according to claim 9, wherein a beam spot of the first laser light is completely overlapped with a beam spot of the second laser light.

15. A method for manufacturing a semiconductor device according to claim 9, wherein the noble gas is selected from the group consisting of He, Ne, Ar, Kr, or Xe.

16. A method for manufacturing a semiconductor device according to claim 9, wherein a concentration of the noble gas is in the range of $1 \times 10^{18}$ atoms/cm$^3$ to $1 \times 10^{21}$ atoms/cm$^3$.

17. A method for manufacturing a semiconductor device according to claim 9, wherein a magnetic flux density of the magnetic field is in the range of 1000 G to 10000 G.

18. A method for manufacturing a semiconductor device according to claim 9, wherein the semiconductor film is added with the first noble gas by an ion doping method.

* * * * *